(12) United States Patent
Teng et al.

(10) Patent No.: US 11,183,426 B2
(45) Date of Patent: Nov. 23, 2021

(54) METHOD FOR FORMING A FINFET STRUCTURE THAT PREVENTS OR REDUCES DEFORMATION OF ADJACENT FINS

(71) Applicant: Taiwan Semiconductor Manufacturing Company, Ltd., Hsinchu (TW)

(72) Inventors: Yun Chen Teng, New Taipei (TW); De-Wei Yu, Ping-tung (TW); Chien-Hao Chen, Chuangwei Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 180 days.

(21) Appl. No.: 16/400,954

(22) Filed: May 1, 2019

(65) Prior Publication Data
US 2020/0105605 A1 Apr. 2, 2020

Related U.S. Application Data

(60) Provisional application No. 62/737,304, filed on Sep. 27, 2018.

(51) Int. Cl.
| | |
|---|---|
| *H01L 21/8234* | (2006.01) |
| *H01L 21/02* | (2006.01) |
| *H01L 21/324* | (2006.01) |
| *H01L 21/321* | (2006.01) |
| *H01L 29/66* | (2006.01) |
| *H01L 21/3213* | (2006.01) |
| *H01L 21/311* | (2006.01) |

(52) U.S. Cl.
CPC .. *H01L 21/823431* (2013.01); *H01L 21/0262* (2013.01); *H01L 21/02532* (2013.01); *H01L 21/02592* (2013.01); *H01L 21/324* (2013.01); *H01L 21/3212* (2013.01); *H01L 21/32133* (2013.01); *H01L 21/823437* (2013.01); *H01L 29/66545* (2013.01); *H01L 21/02636* (2013.01); *H01L 21/31116* (2013.01); *H01L 21/823418* (2013.01); *H01L 29/6656* (2013.01); *H01L 29/6659* (2013.01); *H01L 29/66636* (2013.01)

(58) Field of Classification Search
CPC ........ H01L 21/823437; H01L 21/0262; H01L 21/02532; H01L 21/02636; H01L 21/823418; H01L 21/31116; H01L 21/32055; H01L 27/0886; H01L 29/66545; H01L 29/6659; H01L 29/6656; H01L 29/7853; H01L 29/66636; H01L 29/66795; H01L 21/0243; H01L 21/02667; H01L 21/02494; H01L 21/02502; H01L 21/0245; H01L 21/823431; H01L 21/02592; H01L 21/324; H01L 21/3212; H01L 21/32133
See application file for complete search history.

(56) References Cited

U.S. PATENT DOCUMENTS

2017/0033178 A1* 2/2017 Krishnan ............ H01L 29/7851

* cited by examiner

*Primary Examiner* — Ermias T Woldegeorgis
(74) *Attorney, Agent, or Firm* — Slater Matsil, LLP

(57) ABSTRACT

Methods of forming a material layer are provided. The material layer, such as amorphous silicon, may be formed by repeatedly depositing and annealing amorphous silicon. Periodically, an etching process may be performed to widen openings between fins or other topography if necessary. The depositing, annealing, and etching process may be repeated. Subsequently, an additional layer of amorphous silicon may be deposited to a desired thickness.

20 Claims, 21 Drawing Sheets

METHOD FOR FORMING A FINFET STRUCTURE THAT PREVENTS OR REDUCES DEFORMATION OF ADJACENT FINS

PRIORITY CLAIM AND CROSS-REFERENCE

This application claims the benefit of U.S. Provisional Application No. 62/737,304, filed on Sep. 27, 2018, which application is hereby incorporated herein by reference.

BACKGROUND

The semiconductor industry has experienced rapid growth due to continuous increase in functionality and speed of integrated circuits for any given cost. This has been enabled primarily by continuous improvements in the integration density of functional circuit blocks (e.g., memory arrays, digital logic gates, and analog circuit blocks such as differential amplifiers). A major factor for the higher integration density is miniaturization of electronic components (e.g., transistors, resistors, and capacitors) achieved by increased planar density due to repeated reductions in minimum feature size and, by the use of non-planar structures that utilize the vertical dimension to reduce the planar footprint of the component.

The Fin Field-Effect Transistor (FinFET) device is a FET where the vertical dimension is exploited to reduce its footprint relative to the planar FET structure. The name FinFET reflects the fin-like semiconductor structures protruding from a substrate on which the FET is constructed. A gate structure, configured to control the flow of charge carriers within a conductive channel of the FinFET device, wraps around the sides of semiconductor fins. For example, in a tri-gate FinFET device, the gate structure wraps around three sides of the semiconductor fin, thereby forming conductive channels along the surfaces of the semiconductor fin covered by the gate. Because a portion of the channel current flows horizontally along the vertical sides of the fins, FinFETs may conduct higher current than a planar FET structure with the same footprint. Also, FinFETs generally consume less power than planar FETs with the same switching speed. Thus, despite its complex structure, a technology platform offering FinFETs is being selected more frequently for high performance integrated circuit designs.

BRIEF DESCRIPTION OF THE DRAWINGS

Aspects of the present disclosure are best understood from the following detailed description when read with the accompanying figures. It is noted that, in accordance with the standard practice in the industry, various features may be neither drawn to scale nor depict the same shape as in a fabricated structure. In fact, the dimensions of the various features may be arbitrarily increased or reduced and ideal geometrical shapes may be depicted for clarity of discussion.

DETAILED DESCRIPTION

Figure 1:
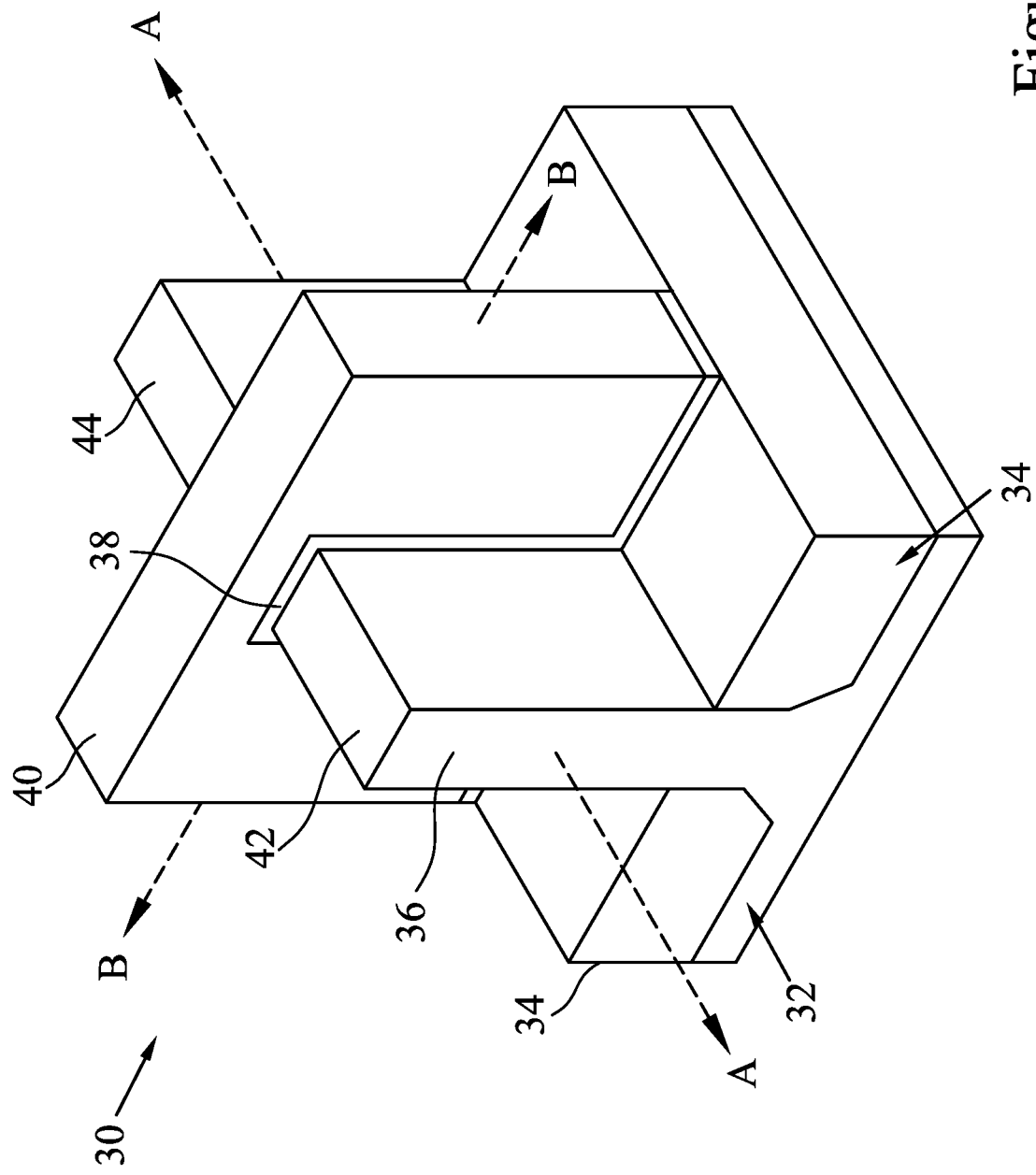
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method to form a FinFET structure will be described that prevents or reduces bending of fins and formation of associated defects. In some embodiments, after the semiconductor fins are formed, the process flow includes a sequence of process steps to deposit amorphous silicon (a-Si). At the initial stages, a-Si is deposited along the sidewalls and bottom surfaces of gaps between adjacent fins. Generally, the composition of the a-Si material is such that the deposited material contains hydrogen. Desorption of hydrogen from a-Si may occur during one or more intermediate process steps that are performed at a stage where the deposited a-Si partially fills the gaps between fins. Loss of hydrogen from a-Si may cause the a-Si volume to shrink and generate strain in the a-Si film adhering to the sidewalls of the fins. Mechanical stresses exerted on the fins by the strained a-Si film may cause the fins to bend towards each other and reduce the space between adjacent pairs near the top of the fins. Constriction of the opening at the top inhibits further deposition of gap-fill materials within the trench, which may lead to incomplete gap-fill with seams and voids in the deposited film. The presence of these defects makes it more likely for various other types of defects (e.g., incomplete spacer removal, polysilicon etch residue, etc.) to form during subsequent process steps. As discussed in greater detail below, a method is provided that allows films to be deposited that may prevent or reduce the deformation (e.g., bending) of surrounding features, such as fins, and to reduce or prevent other types of defects.

Embodiments are provided in the context of depositing a-Si in trenches during formation of, e.g., tri-gate FinFETs formed on a substrate in a manner to prevent or reduce deformation of surrounding features. In particular, the embodiments presented herein are discussed in the context of forming an a-Si layer to be used as a dummy gate in a replacement gate or gate last process, while reducing or preventing deformation of adjacent fins. Other embodiments, however, may be utilized for other three-dimensional (3D) multi-gate MOSFET devices, e.g., double-gate FinFET, omega-gate MOSFET, pi-gate MOSFET and the like. Embodiments may also be used in a gate-first process. It is further understood that aspects of this invention may be utilized in depositing other materials, (e.g., polycrystalline silicon, other semiconductor or conductive materials, or the like), where a change in volume of the deposited materials that occurs after the deposition is halted may cause defects. Change in volume of the deposited materials after the deposition is halted may be due to a number of reasons, such as desorption of impurities (e.g., hydrogen), curing, densification anneal, expansion or contraction caused by changes in temperature and pressure, etc. Additionally, other embodiments may utilize aspects of this disclosure that may prevent or reduce the deformation of the deposited film, e.g., delamination of the deposited layer from the sidewalls of features (e.g., sidewalls of trenches or projections).

FIG. 1 illustrates an example of a FinFET 30 in a perspective view. The FinFET 30 includes a substrate 32 having a semiconductor fin 36. The substrate 32 has isolation regions 34 formed thereon, and the fin 36 protrudes above and between neighboring isolation regions 34. A gate dielectric 38 wraps around the protrusion of fin 36 along its vertical sidewalls and over its top surface. A gate electrode 40 (also referred to as a gate) is over the gate dielectric 38. Source/drain regions 42 and 44 are in the fin 36 on opposite sides of the gate dielectric 38 and gate 40. There may be spacers (not shown in FIG. 1) formed adjacent to the gate and alongside a portion of the fin and the isolation regions. The shapes of features depicted in FIG. 1 may have been simplified and their relative dimensions not drawn to scale in the interest of clarity. For example, the shape of the source/drain regions 42 and 44 are depicted as simple rectangular blocks, but these regions may have more complex geometries and comprise multiple materials, e.g., facets arising from crystal growth along specific crystal orientations, and metallic silicide areas formed self-aligned to contacts, etc. FIG. 1 further illustrates reference cross-sections that are used in later figures. Cross-section A-A extends along a longitudinal axis of fin 36 of the FinFET 30 and in a direction of, for example, parallel to a current flow between the source/drain regions 42 and 44. Cross-section B-B is perpendicular to cross-section A-A and is along a longitudinal axis of the gate 40 and in a direction of, for example, perpendicular to a current flow between the source/drain regions 42 and 44. Subsequent figures refer to these reference cross-sections for clarity.

FIGS. 2 through 14 illustrate various process flows and intermediate stages in formation of a FinFET in accordance with some embodiments. In the description of these figures, reference will be made for illustrative purposes to the cross-sections as illustrated in FIG. 1, such as the cross-section along the A-A or the B-B cross-sectional view of FIG. 1.

Figure 2:
FIGS. 2 through 5 illustrate various cross-sectional views of a FinFET device at various stages of fabrication, in accordance with some embodiments.

Referring first to FIG. 2, a cross-sectional view of a substrate 50 along cross-section B-B is provided in accordance with some embodiments. Generally, the substrate 50 may comprise a bulk semiconductor substrate or an SOI substrate. An SOI substrate includes an insulator layer, (e.g., a buried silicon oxide (BOX) layer) below a thin semiconductor layer that is the active layer of the SOI substrate. The semiconductor of the active layer and the bulk semiconductor generally comprise crystalline silicon, but may include one or more other semiconductor materials such as, Ge, silicon germanium alloys, compound semiconductors (e.g., GaAs, InAs, AlAs, GaP, GaN, InSb, CdTe, ZnO, ZnSe, or their alloys), or combinations thereof. The semiconductor materials may be doped or undoped. Other substrates that may be used include multi-layered substrates, gradient substrates, or hybrid orientation substrates. In this example, substrate 50 is a bulk semiconductor substrate, e.g., a bulk silicon substrate.

Figure 3:
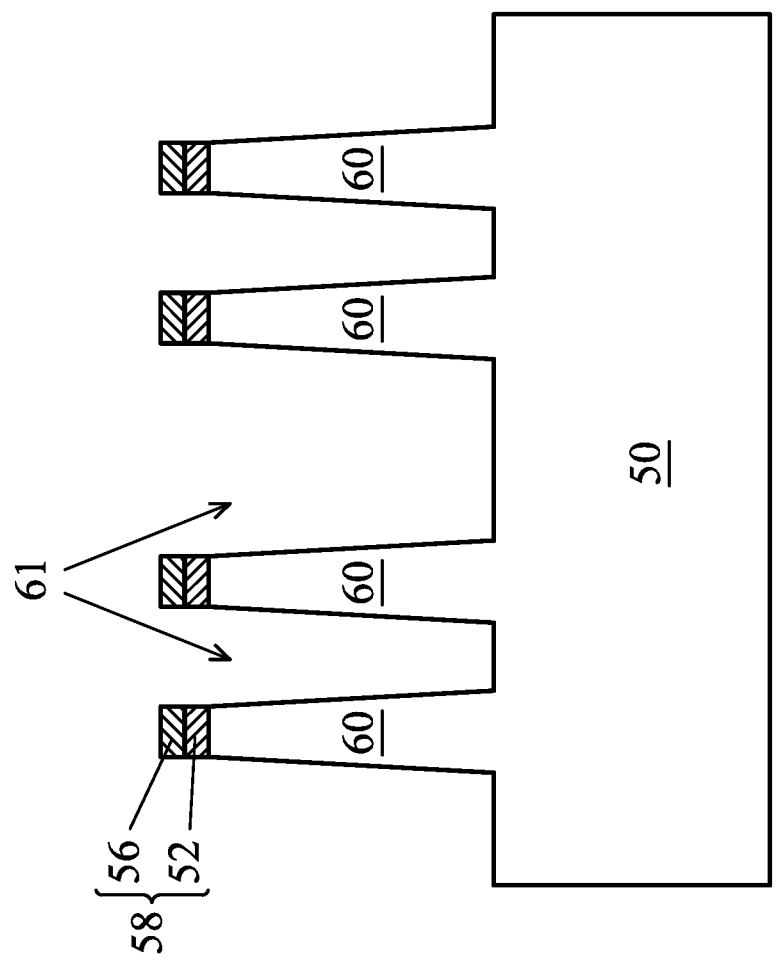

Referring to FIG. 3, substrate 50 may be patterned to form protruding semiconductor strips 60 by etching trenches 61 in substrate 50 using any suitable patterning method. One such method, referred to as Sidewall Image Transfer (SIT), may be utilized. SIT is a double patterning technique that combines photolithography and self-aligned processes, thereby allowing patterns to be created that may have feature sizes smaller than what is otherwise obtainable using a single, direct photolithography process. First, a sacrificial layer (e.g., a silicon oxide layer, not shown in FIG. 3) is formed over substrate 50 and patterned using one or more photolithography and etching techniques (e.g., wet chemical etching, or reactive ion etching (RIE)). Next, one or more layers are deposited over the patterned sacrificial layer to form a spacer layer over the patterned sacrificial layer. For example, a silicon oxide layer 52 and a silicon nitride layer 56 may be deposited to form spacer layer 58. An anisotropic etching technique, e.g., RIE, may be used to form spacers 58 alongside the patterned sacrificial layer, or mandrels. Then the mandrels may be removed by an appropriate selective etch, e.g., a wet chemical etch. The remaining spacers 58, formed self-aligned to the mandrels, may be used as a hardmask 58 to subsequently etch exposed portions of substrate 50 to form trenches 61 in the substrate 50. In some embodiments, the trenches 61 may be strips (in a plan view) parallel to each other, and closely spaced with respect to each other. The top portion of the resulting semiconductor strips 60 protruding from substrate 50 would subsequently be utilized as the fins of FinFET 100. In some embodiments, the trenches 61 may be continuous and surround the semiconductor strips 60. The hardmask 58 may be removed during process steps occurring later in the process flow by etching or any suitable method. This SIT method may be repeated one or more times to form very thin strips that are much thinner than the minimum dimension of the photolithography process.

Figure 4:
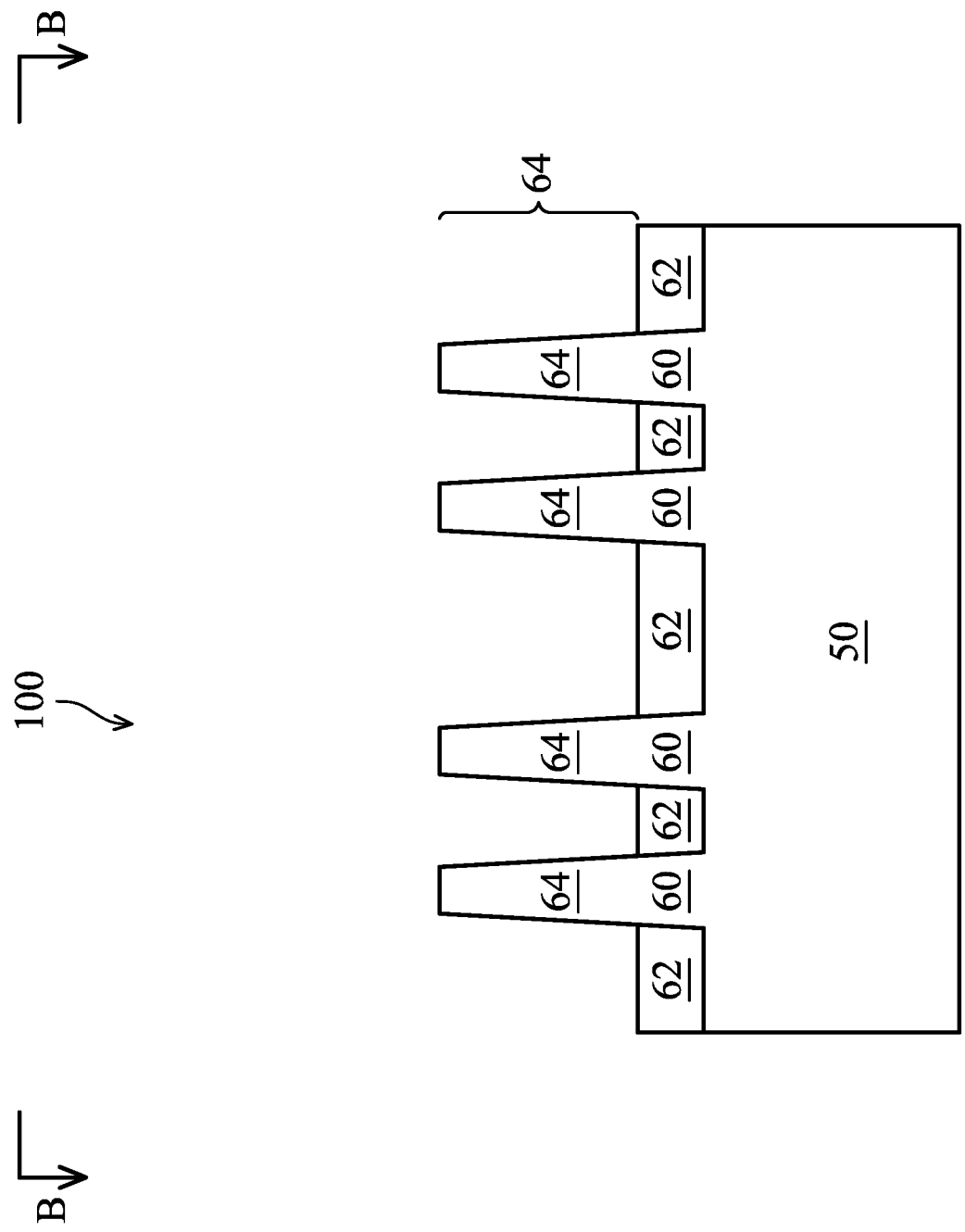

FIG. 4 illustrates shallow trench isolation (STI) regions 62 formed in the region between neighboring semiconductor strips 60 (referred to as the isolation region). In some embodiments, the STI regions 62 may be formed by depositing one or more insulation materials such that the top surface of the deposited layer in the isolation region extends higher than the top surface of semiconductor strips 60. The deposited layer between the semiconductor strips 60 may then be recessed by, for example, a planarization process followed by an etch process, thereby forming the STI regions 62 as illustrated in FIG. 4. In some embodiments, the planarization process used to form the top surfaces of the semiconductor strips 60 and the isolation regions (prior to recess etch) may be a chemical mechanical polish (CMP). In some embodiments, the recess etch to form STI regions 62 in the isolation region may be a wet etch process (e.g., using dilute hydrofluoric acid), or a dry etch process (e.g., using RIE), or a combination thereof. Upper portions of the semiconductor strips 60 protruding from above the isolation regions 62 form semiconductor fins 64 (also referred to as fins 64).

In some embodiments, the STI regions 62 include a liner (not shown), e.g., a silicon oxide layer (not shown) that may be formed through a thermal oxidation of a surface layer of substrate 50 before insulation material is deposited. The insulation material deposited to fill the isolation regions may be an oxide, such as silicon oxide, and may be formed by a chemical vapor deposition (CVD), a low-pressure CVD (LPCVD), an atmospheric pressure CVD (APCVD), rapid thermal CVD (RTCVD), a plasma-enhanced CVD (PECVD), a high density plasma CVD (HDP-CVD), a remote plasma CVD (RPCVD), a flowable CVD (FCVD) (e.g., a CVD-based material deposition in a remote plasma system and post curing to make it convert to another material, such as an oxide), the like, or a combination thereof. Other insulation materials and/or other formation processes may be used. An anneal process may be performed once the insulation material is formed.

As discussed above, FIGS. 2 through 4 illustrate an embodiment of forming fins 64 by a method that includes forming trenches in the substrate 50 to create semiconductor protrusions. In other embodiments, fins may be formed using methods where semiconductor protrusions are formed by depositing semiconductor material over a pattern of exposed regions of substrate 50 using, for example, selective epitaxial growth (SEG). In one example, trenches may be patterned in a dielectric layer formed over a top surface of a substrate such that the trenches patterned in the dielectric layer expose strips of the surface of substrate 50. Crystalline homo/heteroepitaxial structures comprising semiconductor material same/different from the substrate material can be deposited in the trenches using SEG. The dielectric layer may then be recessed such that the epitaxial structures protrude from the dielectric layer to form the fins. Yet other embodiments may use other methods to form fins. For example, the semiconductor strips 60 can be recessed, and a material different from the semiconductor strips may be epitaxially grown in their place. The semiconductor material to form fins generally comprise crystalline silicon, but various embodiments may include one or more other semiconductor materials such as, Ge, silicon germanium alloys, compound semiconductors (e.g., GaAs, InAs, AlAs, GaP, GaN, InSb, CdTe, ZnO, ZnSe, or their alloys), or combinations thereof. The semiconductor materials may be doped or undoped.

Figure 5:
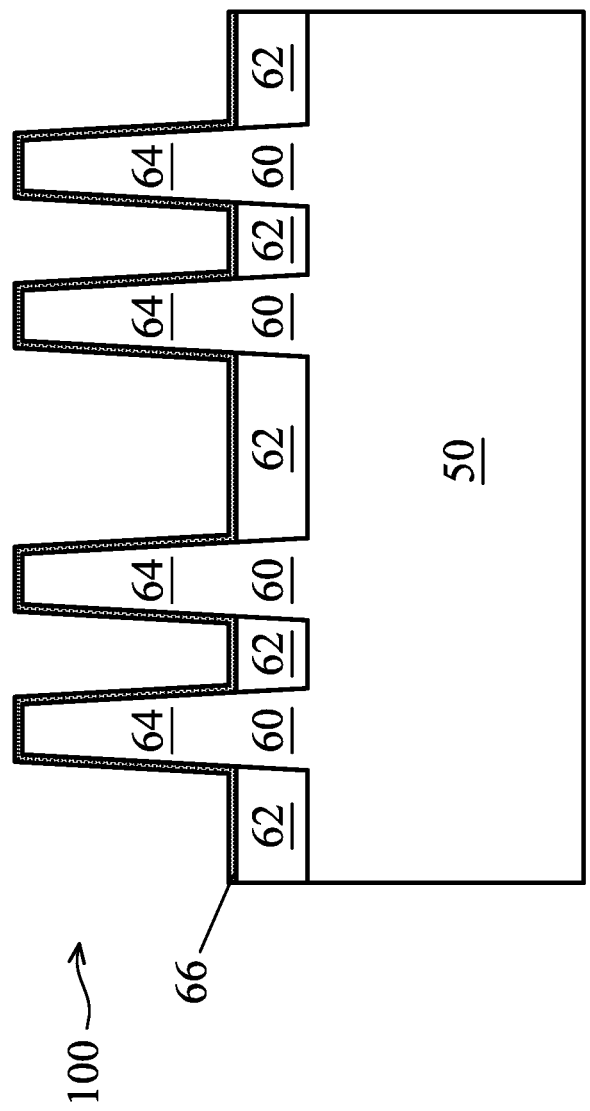

Referring now to FIG. 5, a gate dielectric material 66 (e.g., silicon oxide, silicon nitride, a high-k dielectric, such as, hafnium oxide, aluminum oxide, etc., multilayers thereof, or the like) may be deposited over the exposed surface of the fins 64 and the STI regions 62 using a deposition method such as CVD, RTCVD, PECVD, RPCVD, atomic layer deposition (ALD) etc., or combinations thereof. In other embodiments, gate dielectric material may be deposited over the exposed surface of the fins 64 by thermal oxidation of the semiconductor surface, or by a combination of oxidation and other deposition techniques.

Next a dummy gate material may be deposited over the surface of gate dielectric material 66 and then planarized by a suitable process, such as by CMP. Amorphous silicon may be preferred because of advantages in patterning, e.g., patterned a-Si lines generally have smooth edges. Generally, during the deposition processes $H_2$ gas from the dissociation of silane may diffuse into the bulk of the a-Si film, or the hydrogen may be adsorbed in the a-Si close to the surface and remain there while the surface gets covered by the ongoing deposition of a-Si material. Hydrogen can be incorporated in the a-Si either as Si—H covalent bonds or as atomic H trapped in between Si atoms.

Hydrogen adsorbed in the a-Si matrix during deposition is likely to desorb when the deposition is stopped. Initiating an exhaust step may aid in the hydrogen desorption. Desorption of hydrogen causes the a-Si film deposited inside the trenches between fins to shrink. Shrinkage of a-Si adhering to the trench sidewalls pulls adjacent fins towards each other. Uneven stresses caused by unequal thicknesses of a-Si on opposing sides of a fin or uneven spacing of the fins, such as for the fins illustrated in FIGS. 7A through 7C, may cause the fins to lean or bend. There may be more a-Si on the sidewalls of a narrower trench as the films deposited on the sidewalls merges near the bottom earlier, as illustrated in FIGS. 7B and 7C. If the magnitude of uneven tensile stress on a pair of opposing sidewalls is excessive then the fin may bend. Bent fins may cause defects during subsequent processing. Such undesirable bending of fins may be reduced or prevented by the deposition/anneal cycling illustrated in the flow diagram in FIG. 6.

Figure 6:
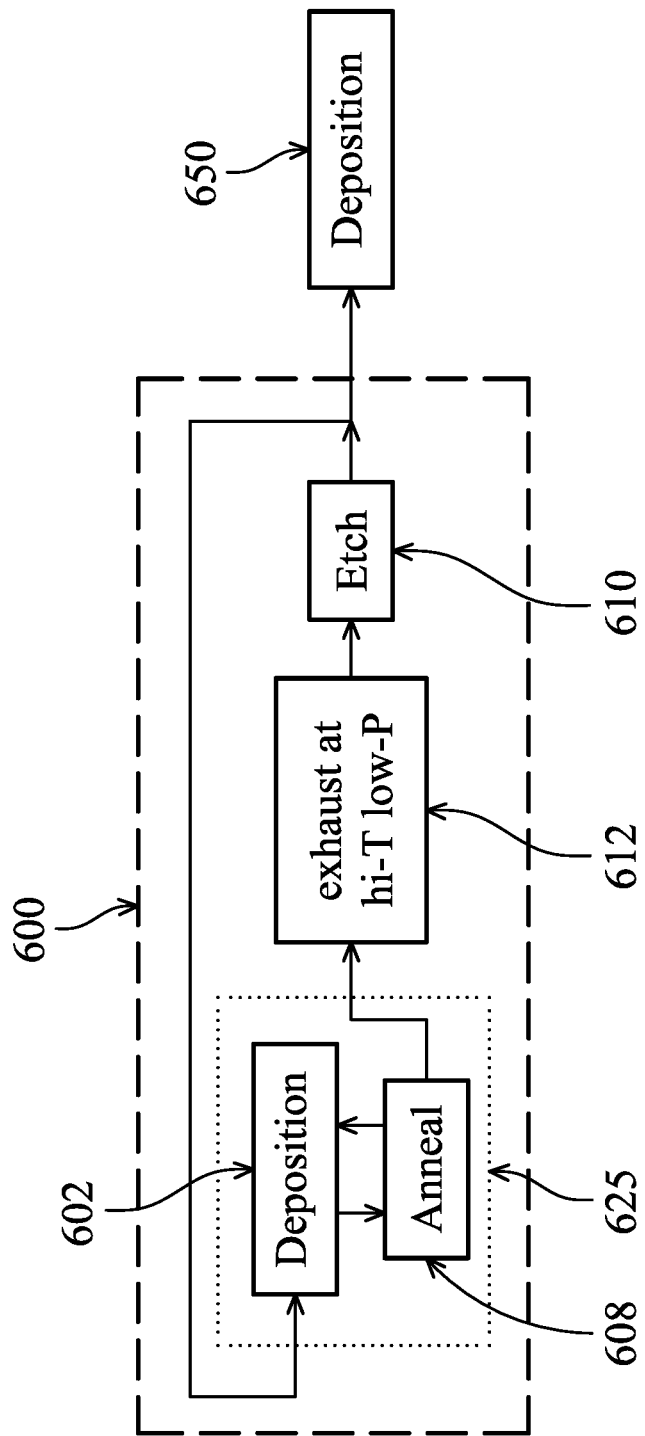
FIG. 6 illustrates a process flow used to deposit a layer which forms a portion of the dummy gate structure, in accordance with some embodiments.

As discussed in greater detail below, FIG. 6 illustrates a process of depositing, for example, a-Si in which the bending of the fins is reduced or prevented. Generally, FIG. 6 illustrates a multi-stage deposition process comprising a deposition/etch cycle 600 and a final deposition process 650. The deposition/etch cycle 600 comprises a deposition/anneal process 625, an exhaust process 612, and an etch process 610, which processes may be repeated numerous times. The deposition/anneal process 625 further comprises a deposition process 602 and an anneal process 608, which processes may also be repeated numerous times. The deposition/etch cycle 600 may be performed numerous times until the aspect ratio of the gaps between fins have been substantially reduced. As will be explained in greater detail below, performing numerous deposition/anneal cycles 625 (prior to performing an exhaust process 612 and an etch process 610) may be used to prevent or reduce the deformation of neighboring fins caused by the stresses. After the aspect ratio of the gaps between fins is substantially reduced, a final deposition 650 is performed to complete the deposition process to its targeted thickness.

Figure 7A:
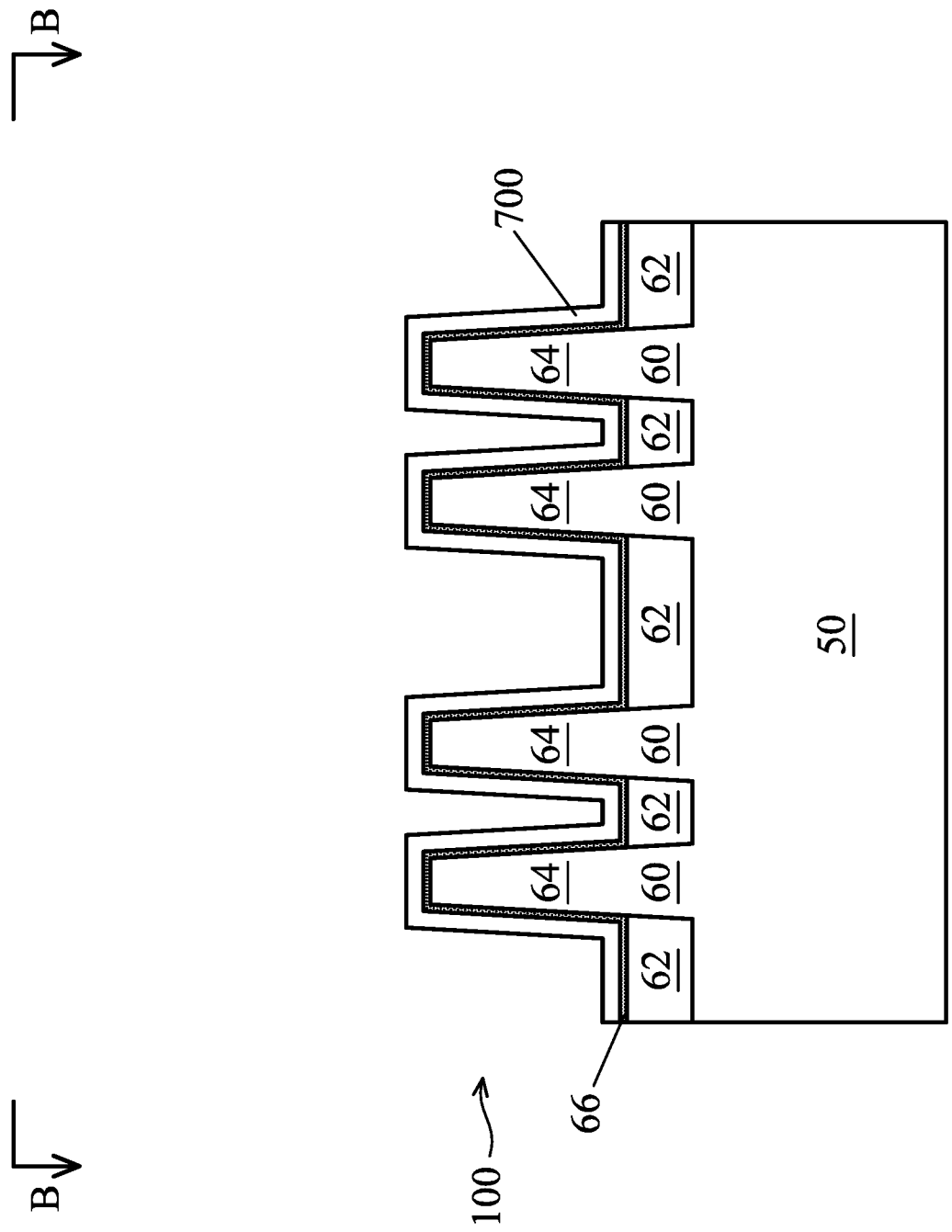
FIGS. 7A-7C illustrates a cut-away view along the line B-B (of FIG. 1) following the deposition/anneal cycle.
Figure 7B:
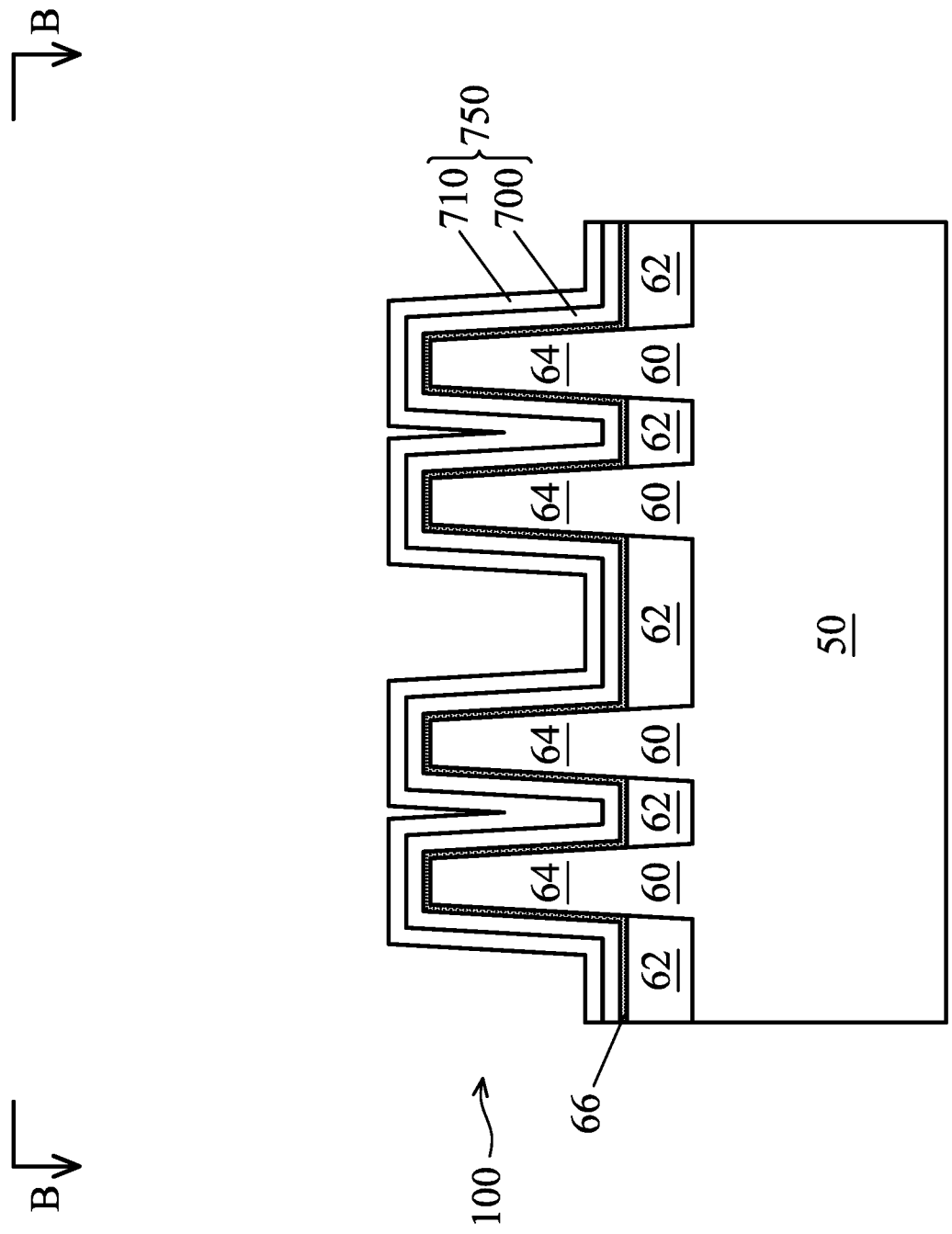
Figure 7C:
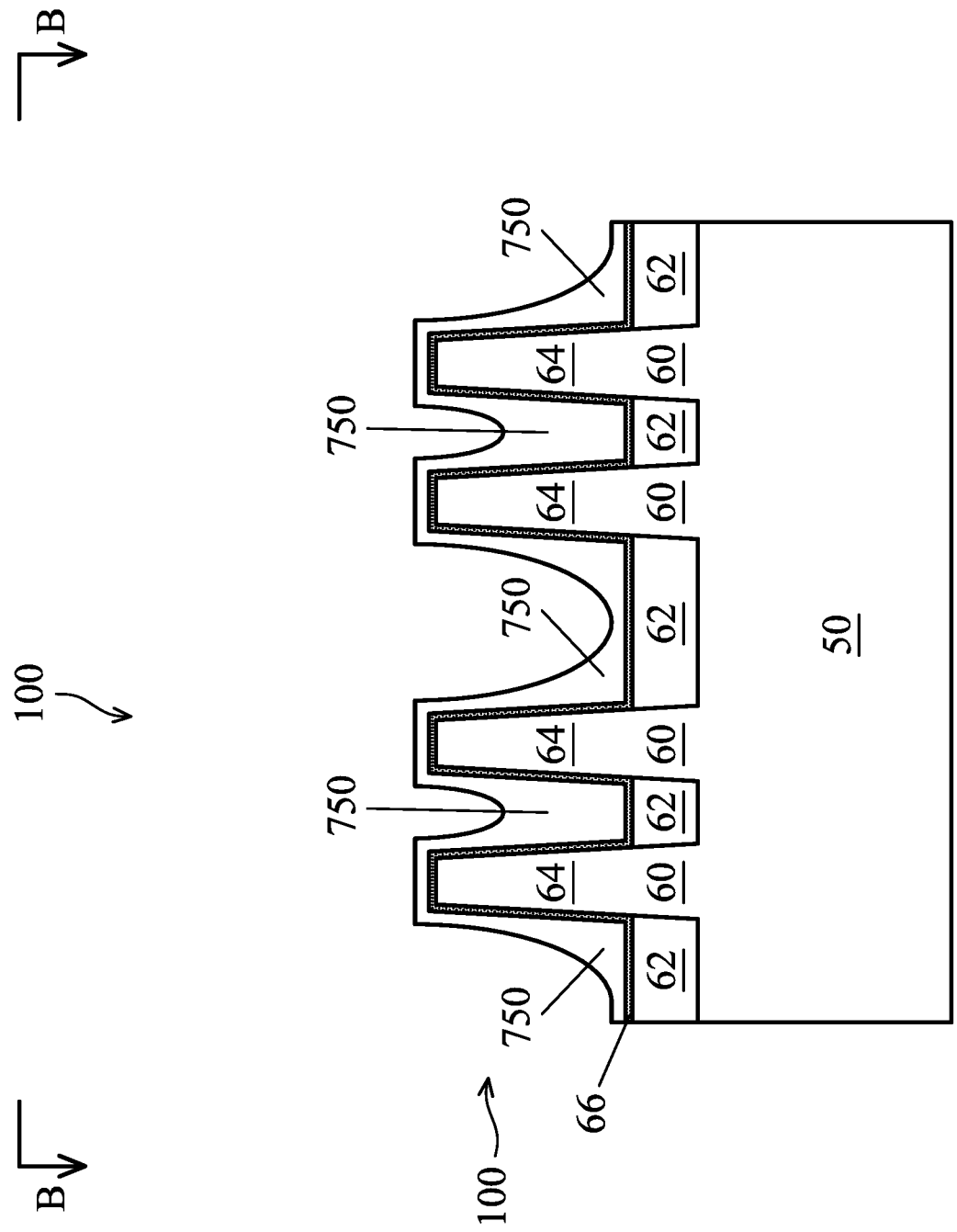

As illustrated in FIGS. 6 and 7A, a deposition process 602 deposits a first layer 700 of a-Si to a thickness of about 0.5 nm to about 5 nm. Deposition of a-Si may use techniques such as, CVD, PECVD, RPCVD, or the like. In some embodiments, a-Si may be deposited by a CVD process using pyrolysis of a silane ($SiH_4$) gas described by the chemical reaction: $SiH_4 \rightarrow Si + 2H_2$ at a temperature of about 400° C. to about 600° C. and at a total pressure of about 100 mTorr to about 4.5 Torr. The concentration of silane gas may be about 5% to about 95%, diluted in a carrier gas of $N_2$ or $H_2$. CVD deposition of a-Si may also be performed using disilane instead of silane as the precursor gas.

After depositing the layer 700 (see FIG. 7A) of a-Si, an anneal process 608 (see FIG. 6) is performed. In some embodiments, the anneal process 608 may be performed at the same temperature as the deposition process 602, in which case the anneal process 608 may be performed in the same process chamber as the deposition process 602 by halting the flow of reactant gases (e.g., silane, dichlorosilane, or the like) used to deposit a-Si, and maintaining the substrate in an inert ambient (e.g., $N_2$, Ar, or the like). In other embodiments, the anneal process 608 may be performed at a higher temperature relative to the temperature of the deposition process 602. Additionally, the anneal process 608 may be performed at a same pressure as the deposition process 602. For example, in embodiments in which the a-Si 700 is deposited using a reactant gas of silane diluted in $N_2$ or $H_2$ at a temperature of about 400° C. to about 600° C., the anneal may be performed by halting the flow of silane such that the substrate remains in an ambient of $N_2$, or $H_2$, or the like, or a combination thereof at the deposition temperature of about 400° C. to about 600° C. for a time of about 10 seconds to about 1200 seconds. In some other embodiments, the anneal may be performed by substantially reducing the flow of silane while maintaining the ambient of $N_2$, or $H_2$, or the like at the deposition temperature of about 400° C. to about 600° C. for a time of about 10 seconds to about 1200 seconds. The pressure during anneal may also be maintained at the same pressure used for deposition. An exemplary anneal process 608 may be an anneal done at 485° C. for 120 seconds in a nitrogen ambient. During the anneal process 608, hydrogen may desorb from the a-Si into the ambient. After the anneal, a volume of the a-Si 700 may be decreased by about 0.01% to about 15%.

The deposition process 602 and the anneal process 608 may be repeated any number of times. For example, after the anneal process 608 is performed, the flow of reactant gases (e.g., silane) may be renewed, resulting in a second a-Si layer 710 being deposited, as illustrated in FIG. 7B. The deposition/anneal process 625 may comprise about one cycle to about 100 cycles to form a combined a-Si layer 750 (illustrated in FIG. 7B). The anneal process 608 inserted in between successive deposition processes 602 of thin a-Si films allows hydrogen desorption periodically in small amounts and relatively equally from the opposing sidewalls of each fin. This mitigates the problem of a large buildup of uneven tensile stress and thereby can reduce or prevent fins from bending towards each other.

Referring back to FIG. 6, the process flow includes an etch step 610 after the multiple deposition/anneal cycles 625 have formed a-Si layer 750. When deposition of a-Si is halted for the etch step 610, an exhaust step 612 may be performed by purging/vacuuming with $N_2$ gas for about 10 seconds to about 1200 seconds, at a temperature of about 400° C. to about 600° C. and at a pressure of about 4 mTorr to about 4.5 Torr. The subsequent etch step 610, may use, for example, an RIE or sputter etch to thin or remove portions of the a-Si film along upper portions of the trenches 61, thereby reducing the likelihood of a void forming. In some embodiments, the etch step 610 may remove about 0.3 nm to about 5 nm of a-Si by an etch process using $Cl_2$, $F_2$, $Br_2$ or $I_2$ gas for about 10 seconds to about 1800 seconds to enlarge the top dimension of the opening, as illustrated in FIG. 7C. An exemplary etch step 610 may use $Cl_2$, at 360° C., for 60 seconds.

As illustrated in FIG. 6, the deposition/anneal process 625 is renewed after the etch process 610 removes a portion of the a-Si near the top of the trenches to facilitate void-free gap-fill. Such deposition/etch cycles may facilitate void-free filling of narrow, high aspect-ratio openings. The deposition is periodically interrupted to perform an etching step which prevents the top of the trench from getting prematurely sealed off by the films deposited on the trench sidewalls. As discussed above, the a-Si dummy gate is often formed over closely spaced fins protruding from the substrate. As illustrated in FIG. 5, the surface topography over which a-Si is deposited comprises narrow trenches between semiconductor strips. The aspect ratio of these trenches may increase during a deposition step because the opening at the top becomes constricted by the growth of the a-Si films adhering on to adjacent sidewalls of the trenches. As the openings narrow, the deposition rate near the bottom of the trenches decreases because fewer reactant molecules reach the surfaces along the bottom of the trenches. In order to avoid incomplete fill (e.g., voids/seams) inside the gaps between the fins, the first part of the gap-fill process flow may include several cycles of alternating deposition and etch, as shown in FIG. 6. The purpose of periodically etching a-Si before the a-Si layer 68 (shown in FIG. 8A) is fully formed is to remove some of the a-Si near the top and restore adequate space for the gaseous reactants to flow towards the bottom surface of the trenches. The target thickness of a-Si deposited/etched in each deposition/etch cycle depends on the trench geometry in regions of high fin density, e.g., trench width, aspect ratio, and sidewall angle. For example, for a trench width of about 7 nm to about 25 nm, aspect ratio of about 2 to about 9, and a trench sidewall sloped at an angle of 60° to 90° with the horizontal, about 1 nm to about 10 nm of a-Si may be deposited in between successive etches.

Referring back to FIG. 6, the deposition process flow may include a final bulk deposition process 650 to deposit an upper a-Si layer that would complete the a-Si deposition to a target thickness. As discussed above, the deposition/etch processes 600 may be repeated numerous times to create an initial layer of a-Si in the trenches. After this initial layer is deposited, the deposition may be completed by depositing a bulk a-Si upper layer in a single deposition process with little or no deformation of the neighboring fins, and with little or no defects, such as voids/seams. In particular, after depositing the initial layer as discussed above with reference to the deposition/etch process 600, the thickness of the a-Si is such that the aspect ratio of the gaps between adjacent fins are substantially reduced. The aspect ratio of any unfilled portion may be small, eliminating or reducing seam/void defect formation. For example, once the narrowest trenches are partially filled to a level such that the aspect ratio of the remaining gaps may fall below a low target aspect ratio (e.g., aspect ratio equal to 4), the final bulk deposition process 650 may be performed without the intermittent anneals, purges, or etch, thereby reducing processing time. In some embodiments, the final deposition 650 may be performed after depositing an a-Si layer having a thickness of about 10% to about 100% of a height of the fin, depending on the width of the trench.

In some embodiments, the final bulk deposition process 650 may be performed using, e.g., a CVD process using pyrolysis of a silane gas described by the chemical reaction: $SiH_4 \rightarrow Si+2H_2$ at a temperature of about 400° C. to about 600° C. and at a total pressure of about 100 mTorr to about 4.5 Torr. The concentration of silane gas is about 5% to about 95%, diluted in $N_2$. Other embodiments use a plasma assisted process for dissociation of silane. The plasma process may use $SiH_4$ or $Si_2H_6$ gas, at a temperature of about 300° C. to about 600° C., pressure of about 100 mTorr to about 10 Torr, and a RF power of about 80 W to about 800 W at a frequency of about 8 MHz to about 18 MHz. In some embodiments, the final deposition process 650 is performed until the trenches are completely filled and a lowest part of the top surface of the a-Si is about 100 nm to about 250 nm above the top surface of the fins 64.

Figure 8A:
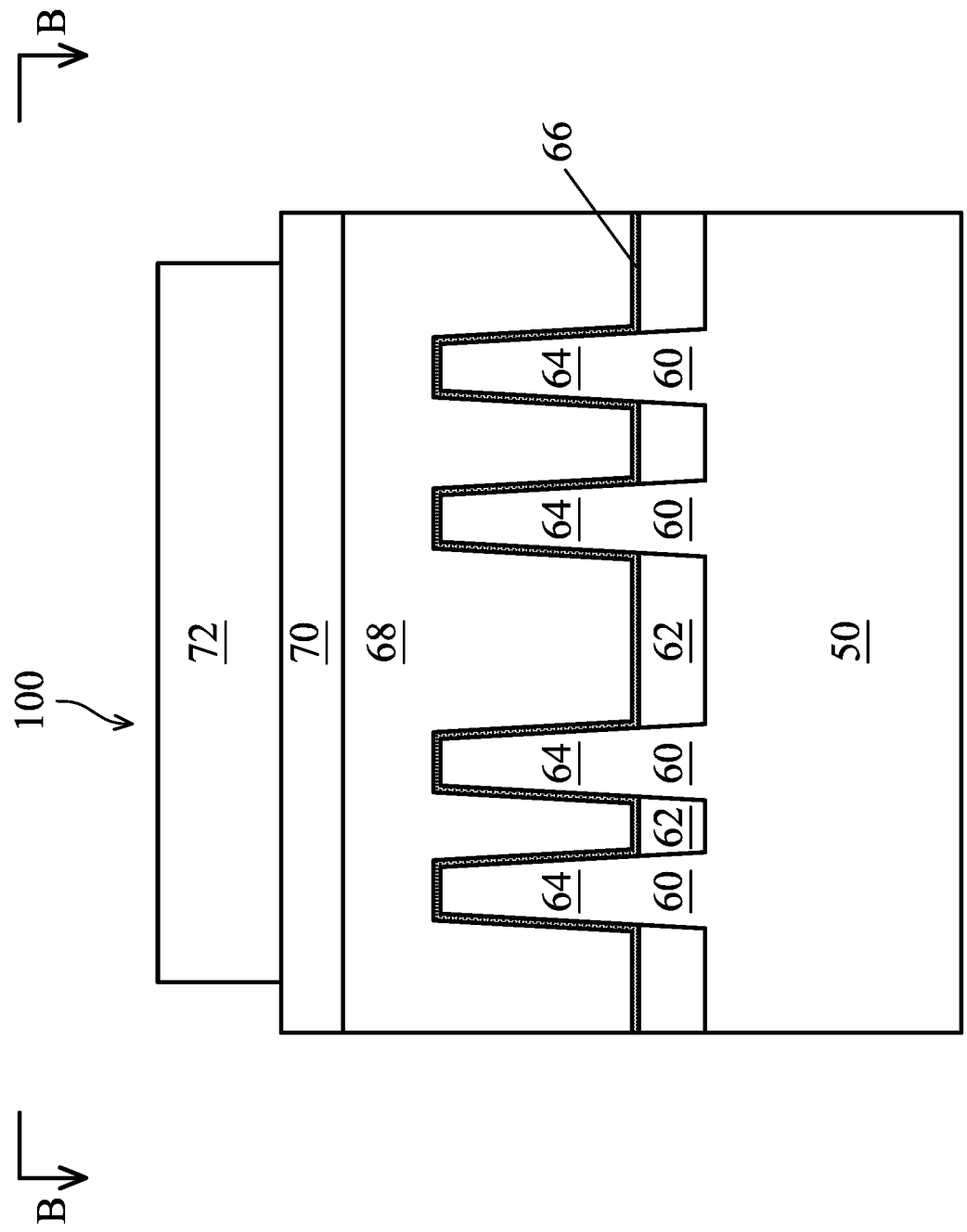
FIGS. 8A-8C illustrates a cut-away view along the line A-A (of FIG. 1) following patterning using photolithography and etching techniques.
Figure 8B:
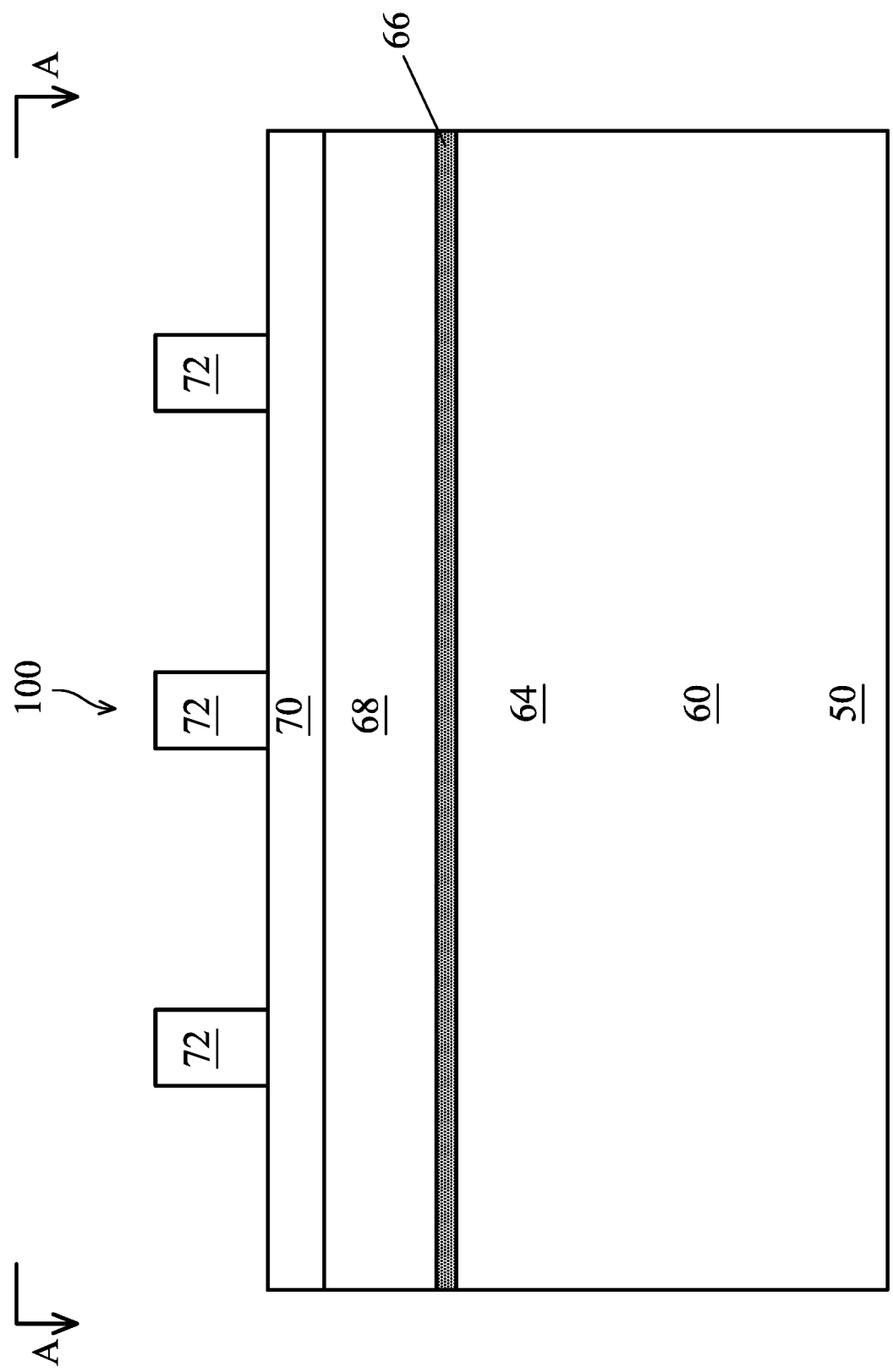

Referring to FIGS. 8A and 8B, the deposited a-Si dummy gate layer may be planarized using a suitable planarization technique, such as CMP, to form dummy gate layer 68. A hardmask layer 70 (e.g., silicon nitride or silicon carbide) may be formed over the planarized dummy gate layer 68 and a patterned photoresist mask layer 72 may be formed over the hardmask layer 70. FIG. 8A illustrates a cross-section of an example of this structure along axis B-B while FIG. 8B illustrates the same structure along axis A-A.

Figure 8C:
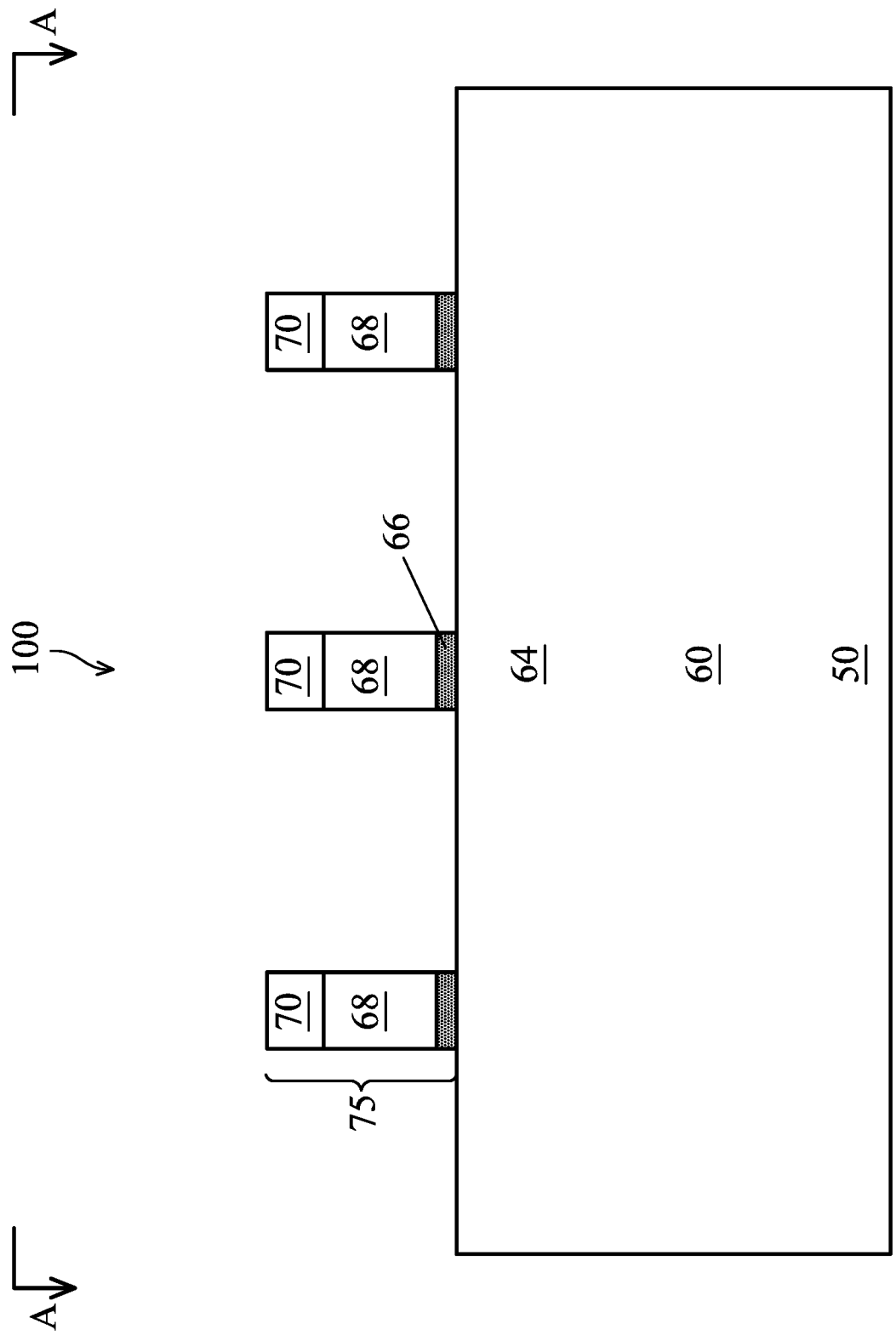

The dummy gate layer 68 and the gate dielectric layer 66 may be patterned using acceptable photolithography and etching techniques. For example, in some embodiments, a hardmask layer 70 (e.g., a silicon oxide, a silicon nitride layer, or the like) may be formed over the dummy gate layer 68. The hardmask layer 70 may be patterned by forming and patterning a photoresist mask layer 72. The pattern of the photoresist mask layer 72 may be transferred to the hardmask layer 70, the dummy gate layer 68 and dummy gate dielectric 66 using an anisotropic etching technique, e.g., RIE, wherein remaining portions of the hardmask layer 70, the dummy gate layer 68 and dummy gate dielectric 66 form dummy gate structures 75 as illustrated in FIG. 8C. FIG. 8C illustrates a cross-sectional view of the structure along axis A-A in which the dummy gate structures 75 are seen extending above fin 64. The dummy gate structures 75 wrap around three sides of the protruding fins. The pattern of the dummy gate structures may be such that long continuous lines of dummy gate fill are shaped to wrap around the fins 64, extend between the fins 64 over the surface of the STI regions 62, and have a longitudinal direction that is substantially perpendicular to a longitudinal direction that of the respective fins 64.

Figure 9A:
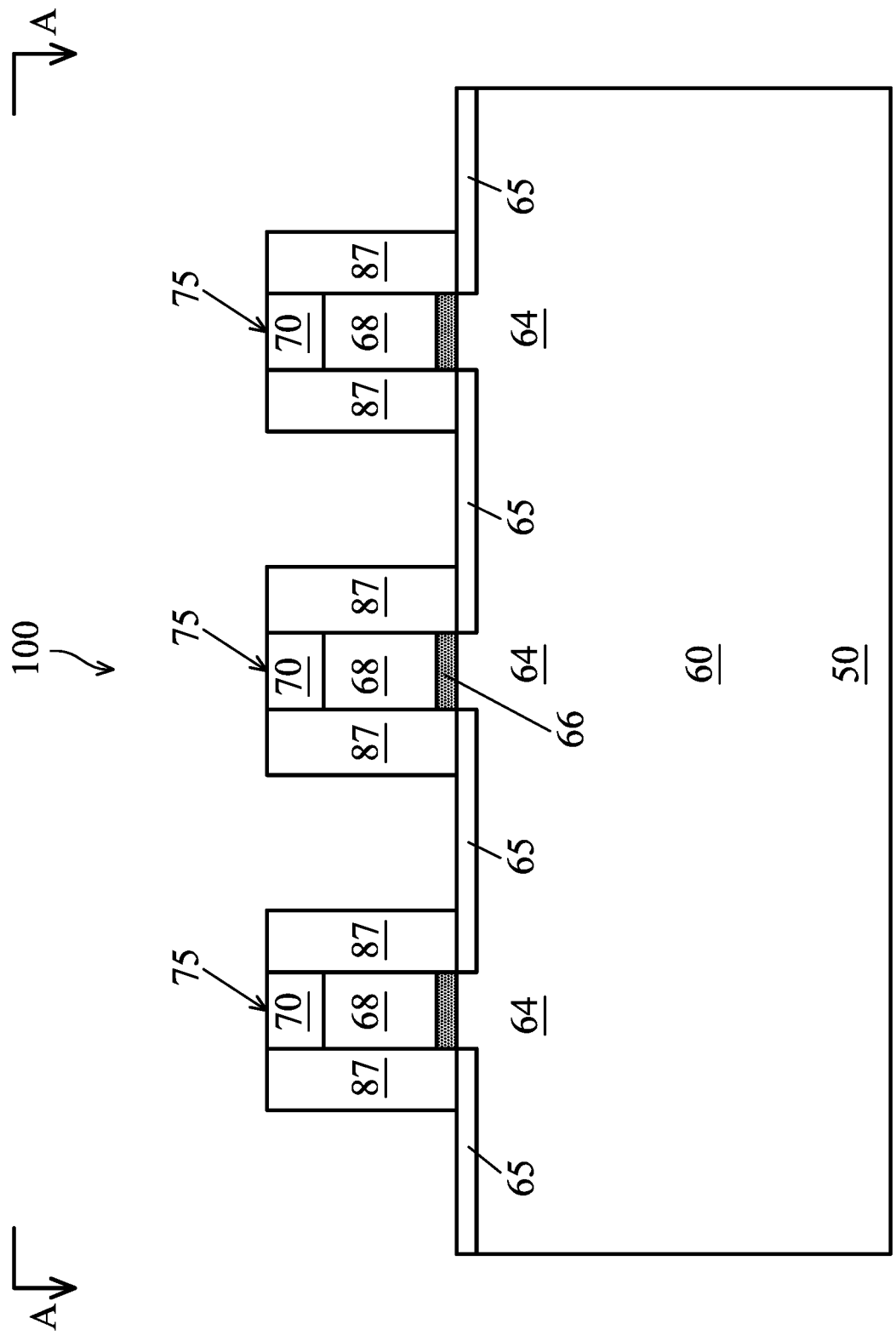
FIGS. 9A-9B illustrates a cut-away view along the line A-A (of FIG. 1) following the formation of the source/drain regions.
Figure 9B:
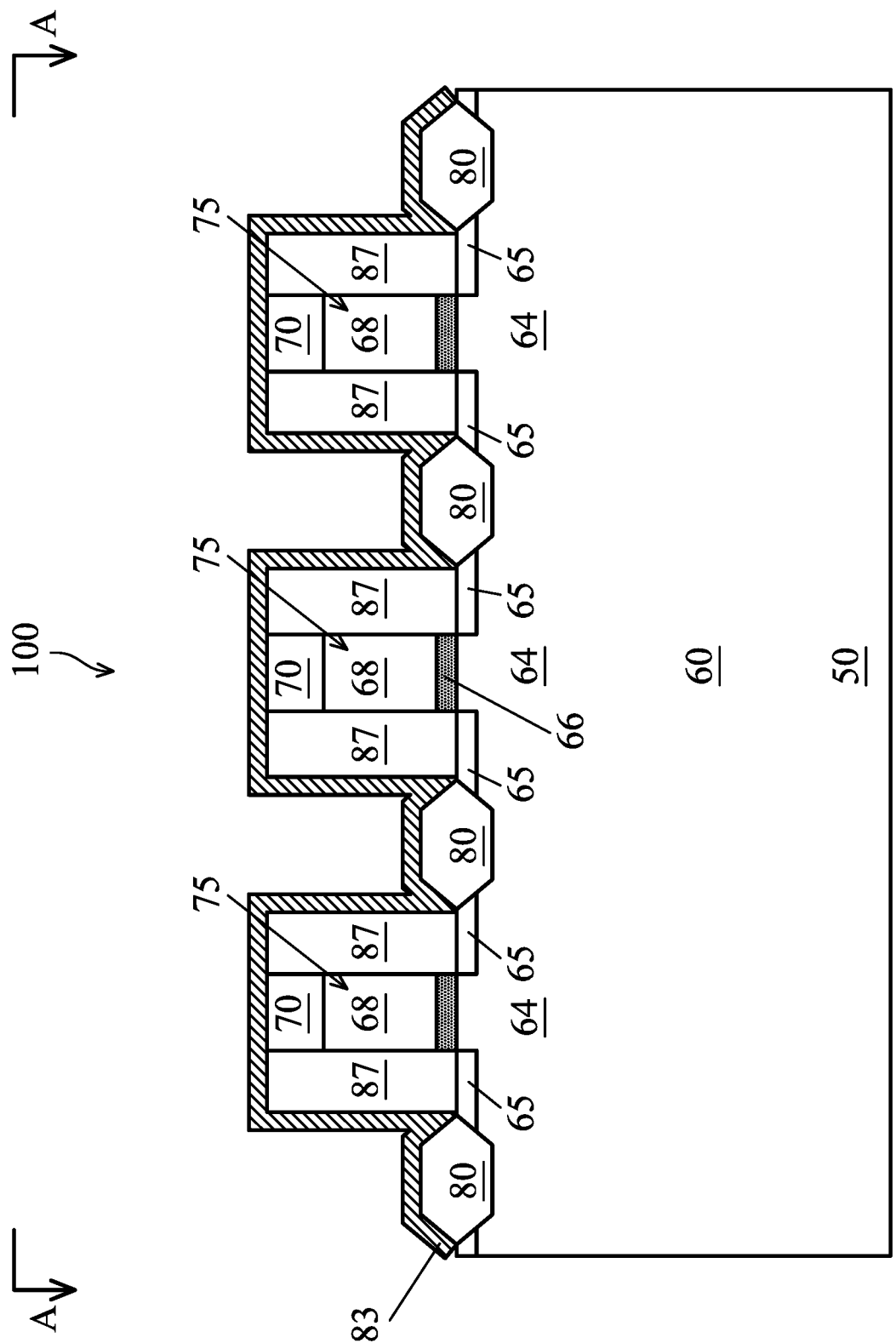

FIGS. 9A and 9B illustrate the formation of the source/drain regions generally comprising lightly doped drain (LDD) regions 65 (see FIG. 9A) and more heavily doped source/drain regions 80 (see FIG. 9B). In some embodiments, lightly doped drain (LDD) regions 65 may be formed, e.g., by implanting n-type or p-type dopants into the tops and sides of fins 64 self-aligned to the dummy gate structures 75, using an ion implantation process. Other embodiments may first form a spacer self-aligned to the dummy gate structures 75 and then implant the LDD dopants self-aligned to the spacer. In some embodiments, the implanted dopants in LDD regions 65 abut the channel region of the FinFET device 100 and portions of LDD regions 65 may extend under the dummy gate structures 75. In some embodiments, both n-type and p-type dopants may be implanted with the dopants of the type opposite that of the channel dopants forming drain extension regions, while those which are the same type as the channel dopants extending further and forming halo regions. Figures referred to in this disclosure illustrate a non-limiting example of the LDD regions 65.

After the LDD regions 65 are formed, spacers 87 are formed on sidewalls of the dummy gate structures 75. The spacers 87 extend laterally onto the upper surface of the fins 64 and the STI regions 62. The spacer formation process includes deposition (e.g. by CVD) and anisotropic etching (e.g., by RIE) of a dielectric layer. The spacer material may include one or more dielectrics, such as silicon oxide, silicon nitride, silicon oxynitride, silicon carbide, silicon carbonitride, the like, or a combination thereof. Spacers of various shapes and formation methods are possible. For example, the spacers 87 may include first spacers (not shown) and second spacers (not shown). In some cases, the first spacers may have an L-shape in a cross-sectional view. In some embodiments, dummy spacers may be formed on the first spacers (not shown) before the epitaxial process of the epitaxial source/drain regions 80 illustrated in FIG. 8, and the dummy spacers are removed and replaced with the second spacers after the epitaxial source/drain regions 80 are formed. All such embodiments are fully intended to be included in the scope of the present disclosure.

In some embodiments described in this disclosure, spacers 87 are formed prior to forming the more heavily doped source/drain regions 80 self-aligned to the spacers 87. The source/drain regions 80 may be formed by first etching the fins to form recesses, and then depositing a crystalline semiconductor material in the recess by a selective epitaxial growth (SEG) process that may fill the recess and, in some embodiments, extend beyond the original surface of the fin to form a raised source/drain structure, as in the example illustrated in FIG. 9B. In some embodiments, the source/drain regions 80 of adjacent fins 64 remain separate source/drain regions 80 while, in other embodiments they may merge to form a continuous epitaxial source/drain region 80. In some cases, the source/drain regions 80 may have facets or may have irregular shapes. The SEG process may use any suitable epitaxial growth method such as, vapor phase epitaxy (VPE), metal-organic CVD (MOCVD), molecular beam epitaxy (MBE), and liquid phase epitaxy (LPE). In some cases source/drain regions 80 may include semiconductors such as, Si, Ge, or the like, or alloy semiconductors such as, silicon-carbon ($Si_{1-x}C_x$), silicon-carbon-phosphorous ($Si_{1-x-y}C_xP_y$), or the like in an n-type FinFET, and silicon germanium ($Si_{1-x}Ge_x$) in a p-type FinFET. In some cases, epitaxial source/drain regions 80 may be implanted with dopants using patterned photoresist masks. In some cases, the epitaxial source/drain regions 80 may be doped in situ during epitaxial growth.

Next, as illustrated in FIG. 9B, a contact etch stop layer (CESL) 83 of a suitable dielectric (e.g., silicon oxide, silicon nitride, or a multilayer combination thereof) is formed over the surface using a deposition technique, such as, CVD, ALD, PECVD, RTCVD, or any other suitable method.

Figure 10:
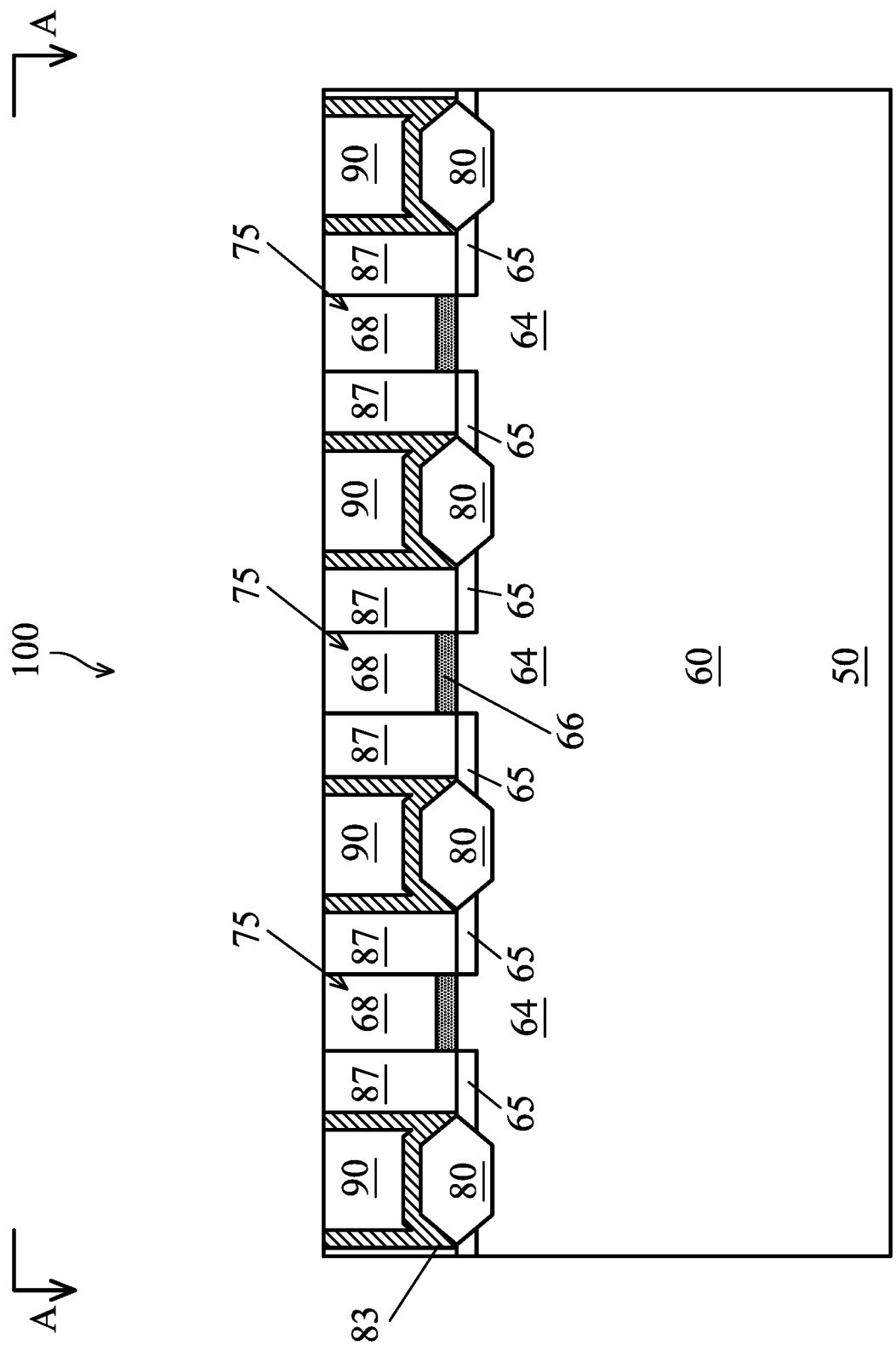
FIG. 10 illustrates a cut-away view along the line A-A (of FIG. 1) following the formation of the interlayer dielectric layer.

Referring now to FIG. 10, a first interlayer dielectric (ILD) 90 is formed over the CESL 83 in accordance with some embodiments. ILD 90 is formed to fill the spaces between dummy gates 75 and between fins 64 to completely cover all the structures entirely with a dielectric such as, silicon oxide, phosphosilicate glass (PSG), borosilicate glass (BSG), boron-doped phosphosilicate glass (BPSG), or the like. The dielectric layers used to form first ILD 90 may be deposited by any suitable method, such as CVD, PECVD, sub-atmospheric CVD (SACVD), FCVD or spin-on, or the like, or combinations thereof. After a first ILD 90 is formed, a planarization process, such as a CMP process, may be performed to remove excess first ILD material to expose the top surface of dummy gate structures 75. In some embodiments, any remaining portion of hardmask 70 over the dummy gates may also be removed by CMP to expose dummy gate fill material 68 and form a top surface where the exposed tops of the gate structures are substantially coplanar with the top surface of the first ILD 90, as illustrated in FIG. 10.

In some embodiments the active gate structure of the FinFET 100 is formed using a gate-last process flow. In a gate-last process flow the dummy gate structures 75, formed after patterning the fins 64 and forming the STI regions 62, are removed and replaced by active gate structures. FIGS. 11A through 12B illustrate cross-sectional views of the FinFET device 100 during processing steps used in replacing the dummy gate structure with the active gate structure.

Figure 11A:
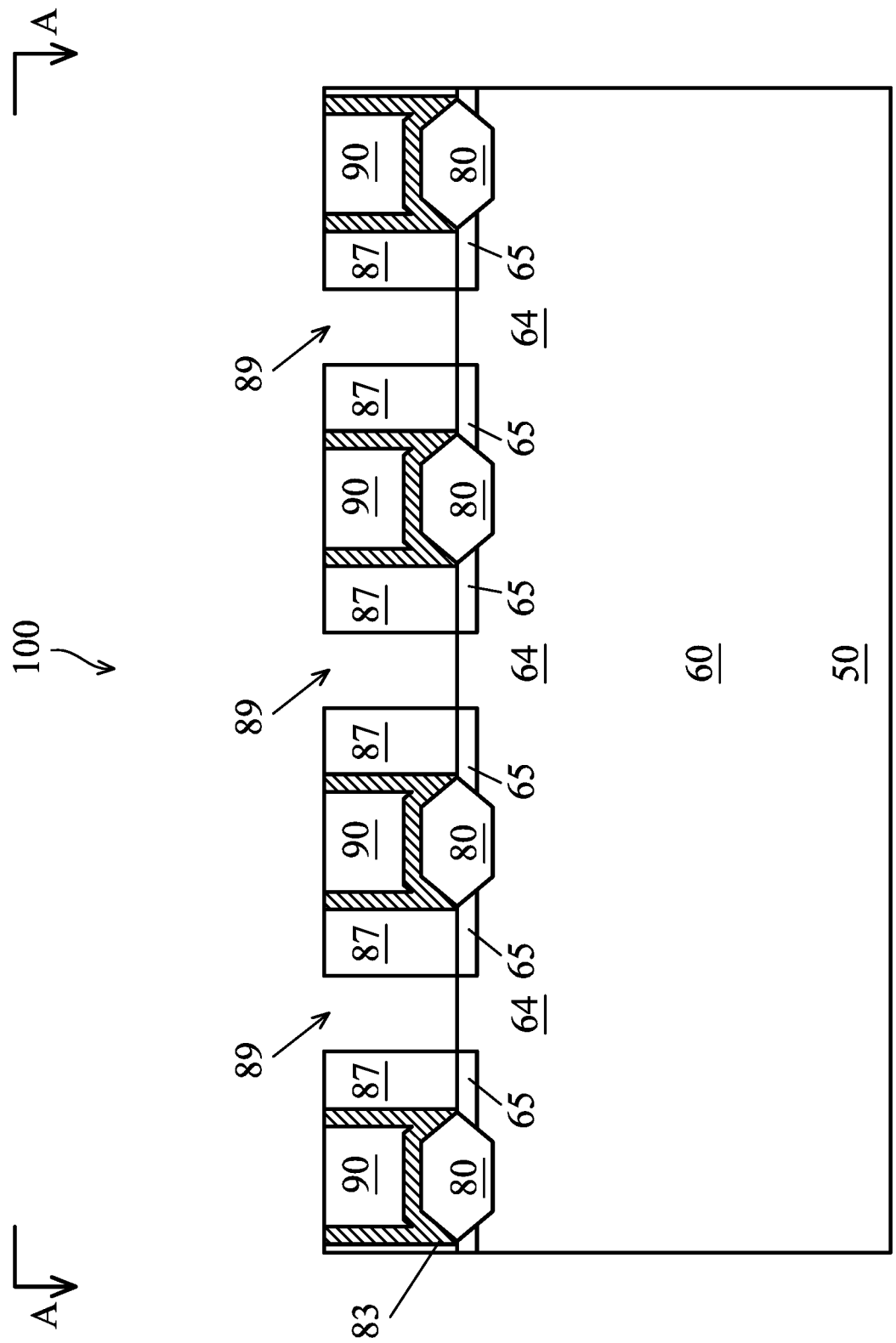
FIG. 11A illustrates a cut-away view along the line A-A (of FIG. 1) of a fin with multiple recesses formed perpendicular to the line A-A.
Figure 11B:
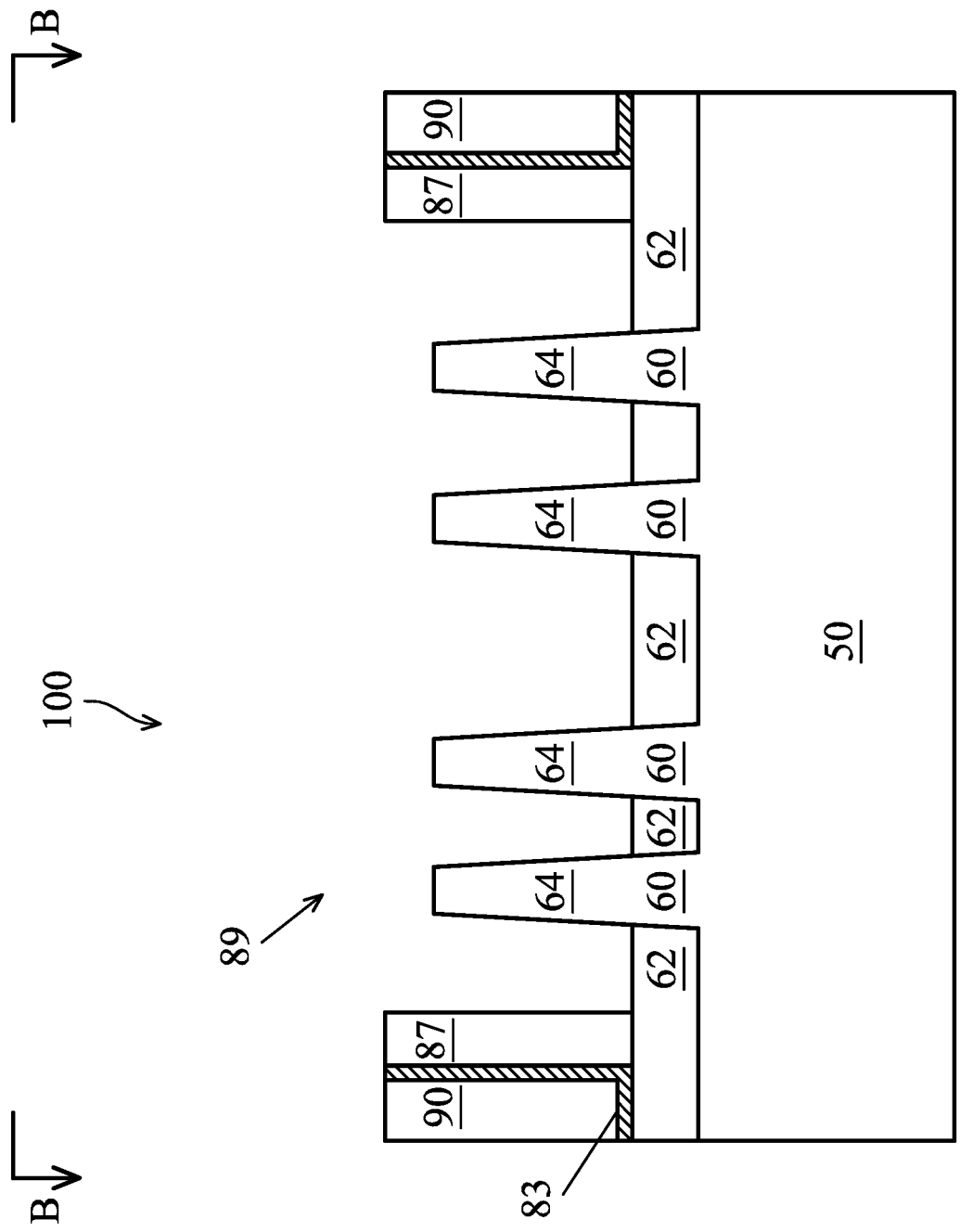
FIG. 11B illustrates a cut-away view along the line B-B (of FIG. 1) of several fins after etching dummy structures.

Referring to FIGS. 11A and 11B, the dummy gate structures 75 (e.g., remaining portion of the dummy gate layer 68 and the dummy gate dielectric 66) may be removed in one or more etching steps, creating recesses 89 between respective spacers 87. In some embodiments, the a-Si dummy gate fill 68 may be removed with a wet chemical etchant (e.g., a solution of KOH, or tetramethylammonium hydroxide (TMAH), or the like), using dummy gate dielectric 66 as an etch stop layer. After removal of the dummy gate layer 68, the dummy gate dielectric 66 may be removed using, for example, an appropriate wet chemical etching technique. FIG. 11A illustrates a cross-sectional view along the longitudinal axis A-A of a fin 64 with multiple recesses 89 formed perpendicular to the axis A-A. Each recess 89 formed on a fin 64 is disposed between neighboring pairs of epitaxial source/drain regions 80 and exposes a channel region of the respective fin 64. FIG. 11B uses a cross-sectional view along the longitudinal axis B-B of a recess 89 to illustrate the recess 89 going over three sides of several fins 64 and along the top of STI regions 62 between fins. The recess 89 is terminated by spacers 87 formed on the respective STI regions 62 at the two ends.

Figure 12A:
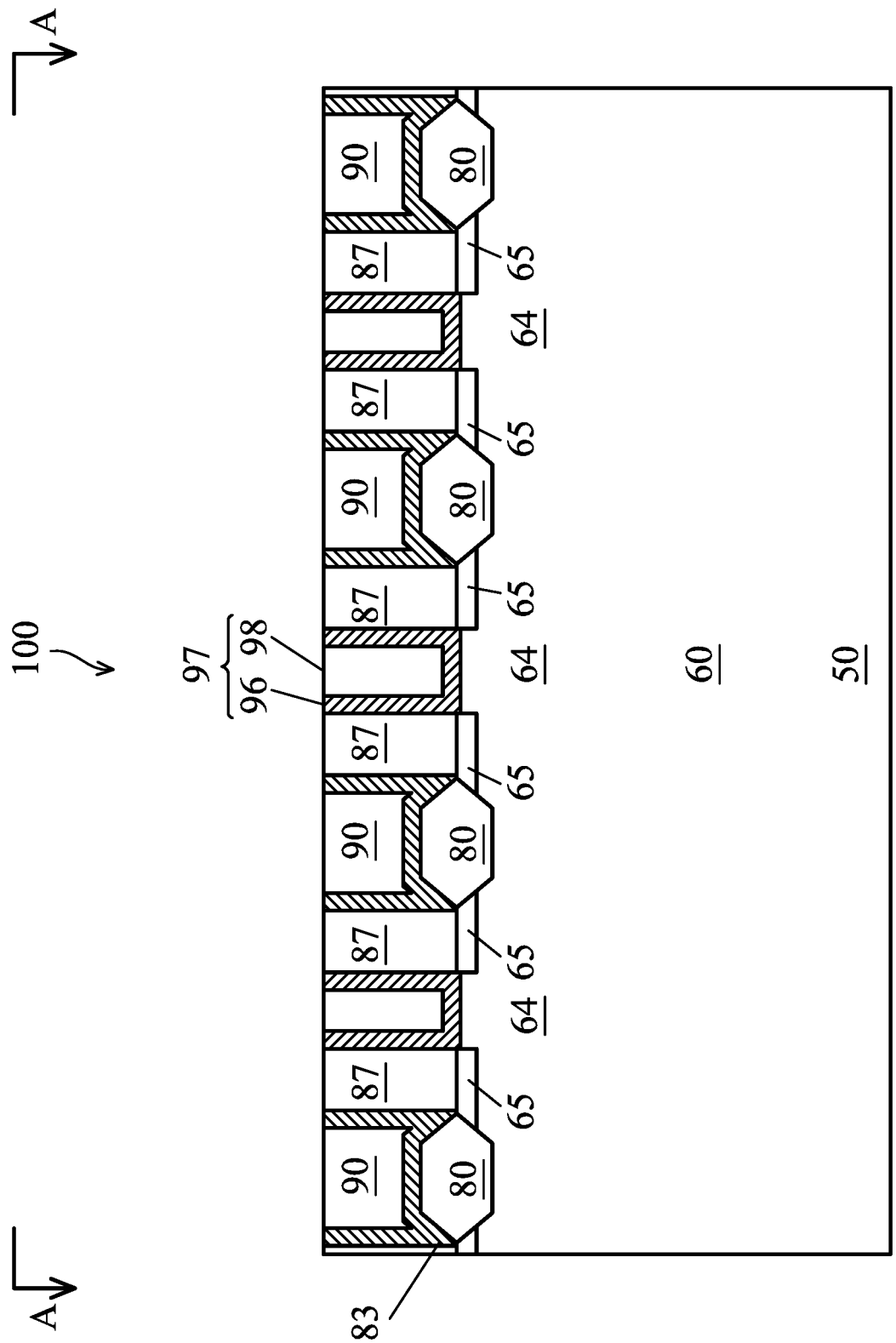
FIG. 12A illustrates a cut-away view along the line A-A (of FIG. 1) following the formation of replacement gate layers.
Figure 12B:
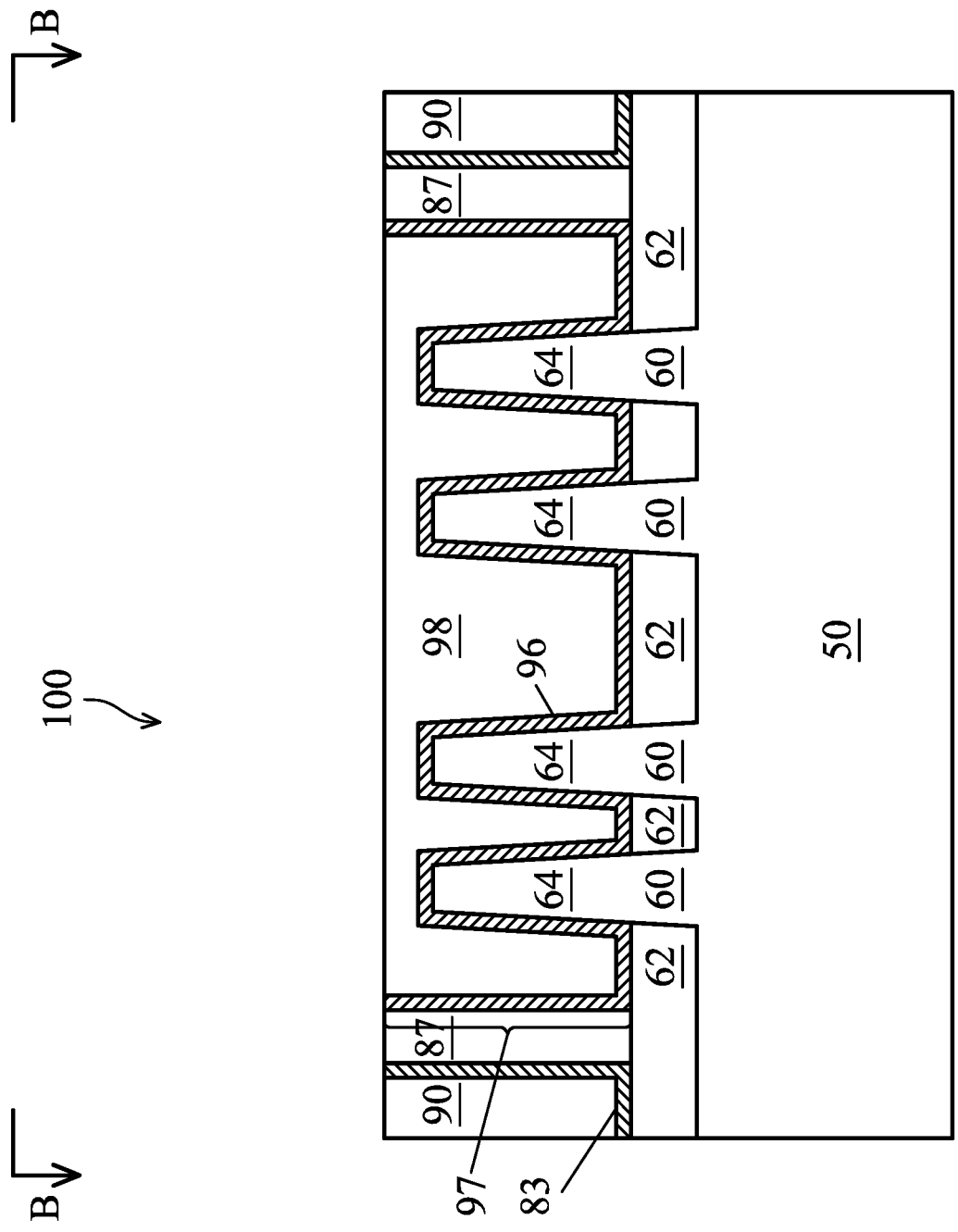
FIG. 12B illustrates a cut-away view along the line B-B (of FIG. 1) of several fins showing a gate structure wrapping around sides of the several fins.

Referring next to FIGS. 12A and 12B, active replacement gate structures 97, comprising a gate dielectric layer 96 and a conductive gate electrode 98, are formed over the exposed channel regions in the recesses. In some embodiments, the gate dielectric layer 96 is formed first. Gate dielectric layer 96 may include a high-k dielectric material, such as, oxides and/or silicates of Hf, Al, Zr, La, Mg, Ba, Ti, and other metals, silicon nitride, and the like, or combinations thereof, deposited using any suitable method, e.g., CVD, MOCVD, physical vapor deposition (PVD), ALD, or the like. The deposited high-k dielectric film is substantially conformal. Gate dielectric layer 96 may also include one or two monolayers of silicon oxide at its interface with the semiconductor material of the channel below. Conductive gate electrode 98 may comprise one or more conductive layers. For example, in some embodiments a multilayered metal gate stack is formed over the gate dielectric layer 96. The multilayered metal gate stack generally comprises a barrier layer, one or more work-function layers, and a gate fill layer formed successively in the recesses and on the top surface. The barrier layer may comprise one or more layers of a material such as, TiN, TaN, Ti, Ta, combinations thereof, and the like. Exemplary work-function material of the work-function layer include TiN, TaN, Ru, Mo, Al, WN, $ZrSi_2$, $MoSi_2$, $TaSi_2$, $NiSi_2$, WN for a p-type FET, and Ti, Ag, TaAl, TaAlC, TiAlN, TaC, TaCN, TaSiN, Mn, Zr for an n-type FET. Other suitable materials or combinations thereof may be used and their thicknesses chosen to tune the work function to achieve a target threshold voltage for the respective FinFET. The gate fill layer may be made of a conductive material such as, Cu, Al, W, TiN, TaN, TaC, Co, Ru, the like, combinations thereof, or multi-layers thereof. The materials used in forming the conductive gate layer 98 may be deposited by any suitable method, e.g., CVD, physical vapor deposition (PVD), ALD, electrochemical plating (ECP), electroless plating, and the like.

After formation of the active replacement gate layers (e.g., gate dielectric layer 96 and conductive gate layer 98), a planarization technique, such as a CMP, may be performed to remove the excess portions of the active replacement gate layers from over the top surface of first ILD 90. The resulting structure, illustrated in FIGS. 12A and 12B, includes substantially coplanar surfaces of the exposed tops of first ILD layer 90, the spacers 87, and the remaining portions of the active replacement gate layers 96 and 98. FIG. 12A illustrates a cross-sectional view of FinFET device 100 along a longitudinal axis A-A through the center of a fin 64 in which the gate structures 97 are seen extending above respective fin 64. FIG. 12B illustrates a cross-sectional view of FinFET device 100 along the longitudinal axis B-B through the center of a gate structure 97 wrapped around three sides of several fins 64 and along the top of STI regions 62 in between fins. The gate structure 97 is terminated by spacers 87 formed on the respective STI regions 62 at the two ends.

Figure 13:
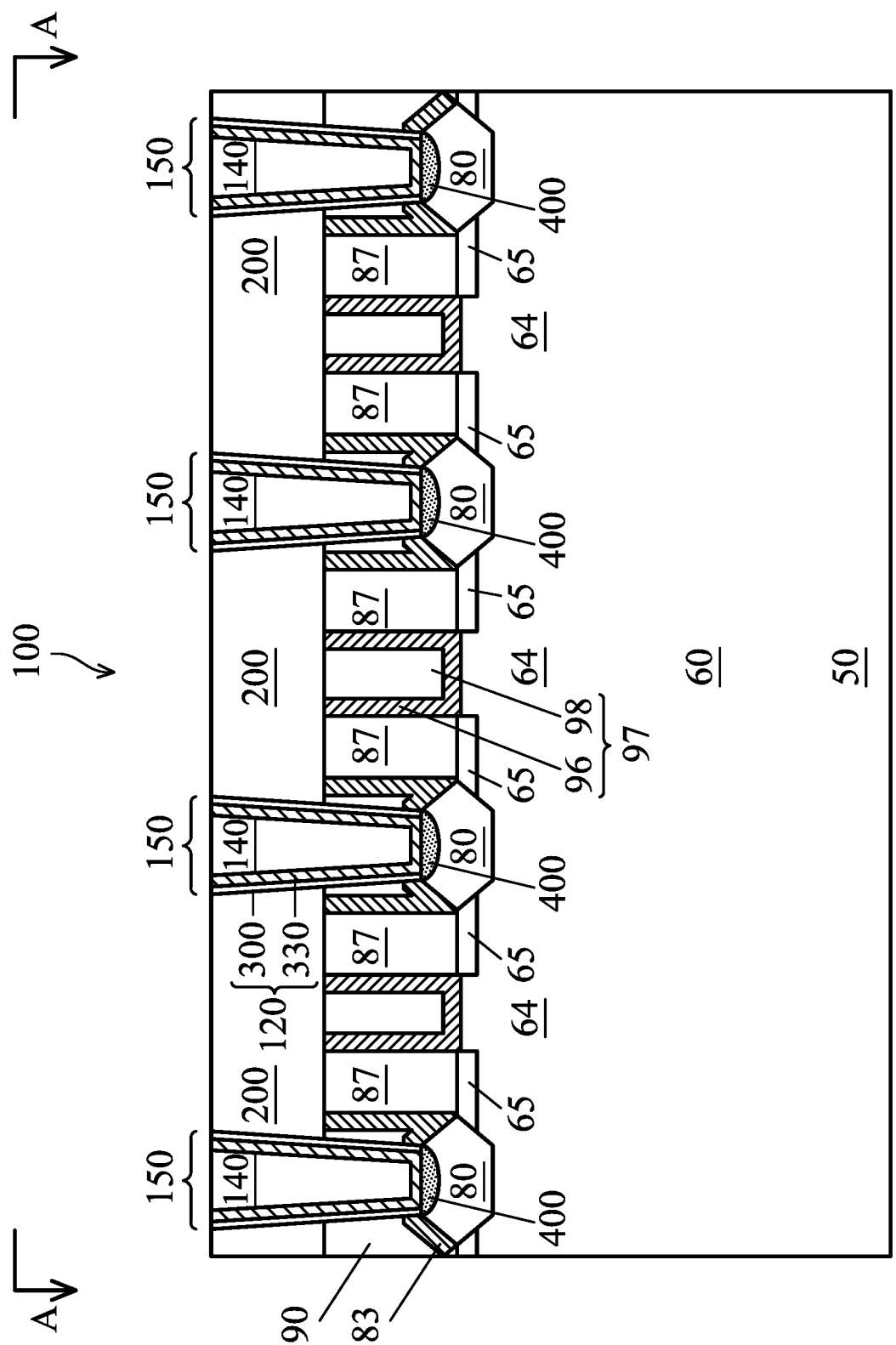
FIGS. 13 and 14 illustrate a cross-sectional view of a FinFET in accordance with some embodiments.
Figure 14:
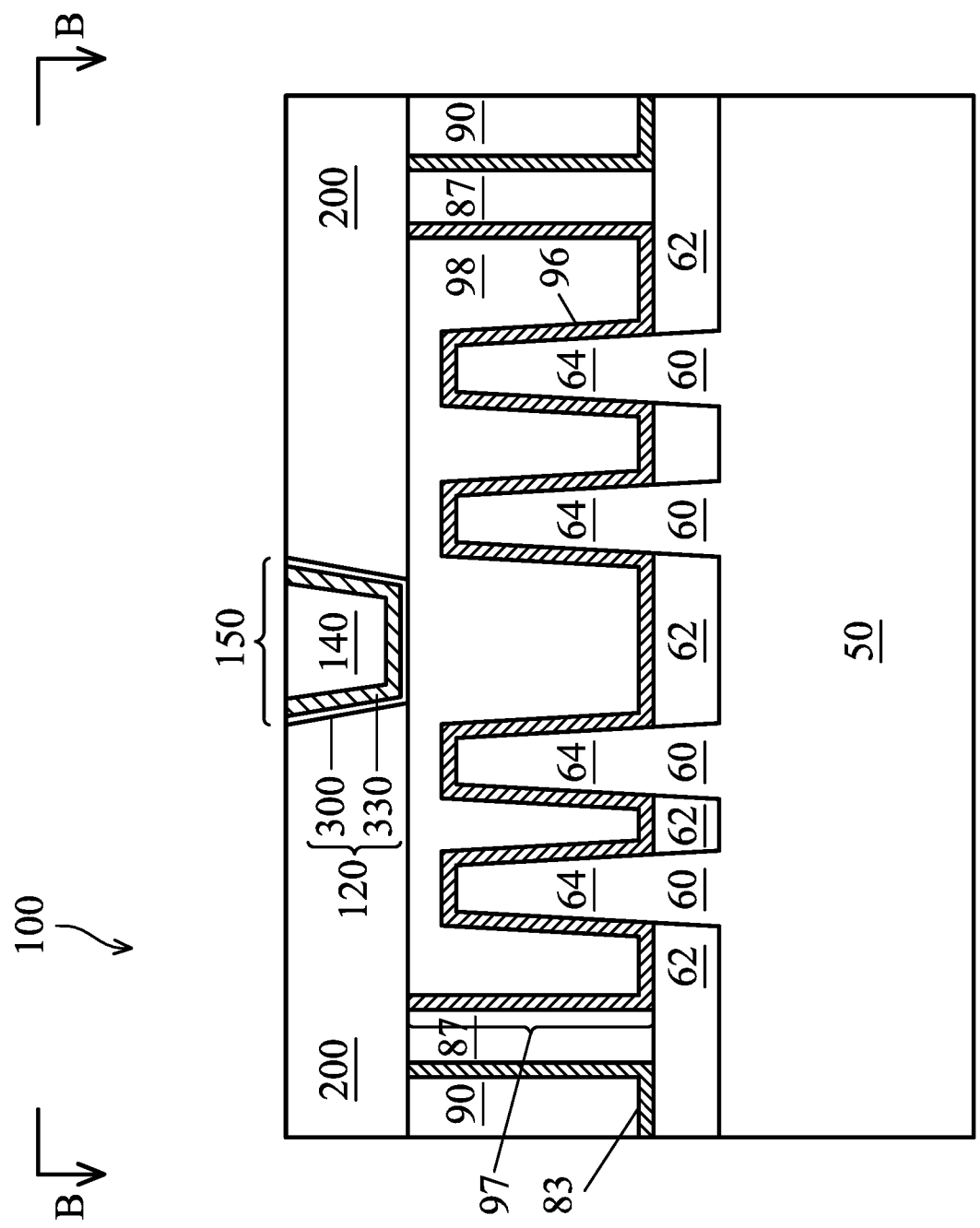

Referring to FIGS. 13 and 14, a second ILD 200 may be deposited over the first ILD 90. The second ILD 200 may be formed of a dielectric material such as PSG, BSG, BPSG, undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, and may be deposited by any suitable method, such as CVD, HDP-CVD, SACVD, PECVD, FCVD, and spin-on. Contact openings are formed extending through the second ILD 200 and/or first ILD 90 using a patterned photoresist mask and/or hardmask using suitable photolithography and anisotropic etching techniques.

FIGS. 13 and 14 illustrate contacts 150 making electrical contact to the source/drain and to a gate electrode of FinFET 100, respectively. The cross-section illustrated in FIG. 13 is taken along a fin in a direction parallel to the direction of current flow in the channel, and the cross-section illustrated in FIG. 14 is taken along a gate in a direction perpendicular to the direction of current flow in accordance with some embodiments. An electronic component formed in the substrate, such as FinFET 100, may be connected to other circuit components, signal lines, and power supply lines using a multilevel interconnect system of conductive interconnect structures comprising lines, contacts, and vias formed in dielectric layers above the substrate 50. Each contact 150 serves as part of an electrical connection between FinFET 100 and a vertically adjacent conductive interconnect structure (not shown). Contacts to source/drain electrodes are formed over active fins (e.g., fin 64 in FIG. 13), and contacts to gate electrodes may be formed over isolation regions (e.g., respective STI region 62 in FIG. 14). Also, contacts to source/drain and contacts to gate are generally located staggered relative to each other. In all such cases, both types of contacts would not appear in one cross-sectional view along axis A-A (illustrated in FIG. 13), nor in one cross-sectional view along axis B-B (illustrated in FIG. 14).

FIG. 13 illustrates contacts 150 formed over epitaxially grown source/drain regions 80 in fin 64. Contact openings over source/drain regions 80 are formed through the second ILD 200, the first ILD 90, and the CESL 83 to expose the source/drain regions 80. The chemistry used to remove the second ILD 200 and the first ILD 90 in regions exposed to the etchants is generally sufficiently selective to the materials in the exposed regions of the gate structure 97, spacers 87, and the CESL 83. After the ILD layers are removed from the contact regions, the chemicals may be switched to other etchants to selectively remove CESL 83 and expose source/drain regions 80. Contacts 150 comprise a conductive liner layer 120 and a conductive fill layer 140. Conductive liner layer 120 comprises one or more metal layers. In some embodiments, the conductive liner layer 120 is formed by depositing a first metal layer 300 of a metal (e.g., Ti, Ni, Pt, Co, other suitable metals, or their alloys) capable of reacting with the semiconductor materials (mentioned earlier in this disclosure) in source/drain regions 80 to form silicide or germanide regions. The first metal layer 300 contacts the exposed surface of the source/drain regions 80. A second metal layer 330 of the conductive liner 120, deposited over the first metal layer 300, may be a metallic barrier layer of one or more metals (e.g., TiN, TaN, Ta, or other suitable metals, or their alloys). The metal layers of conductive liner layer 120 may be deposited using any acceptable deposition technique (e.g., CVD, PECVD, PVD, ALD, or the like, or any combination thereof), and may cover the surface of the openings substantially completely. Next, an anneal step may be performed to cause the first metal layer 300 to react with the semiconductor of the source/drain regions 80 to form a silicide region 400 (illustrated in FIG. 13). In one example, the source/drain region 80 is heavily-doped Si and, Ti and TiN are deposited as the first metal layer 300 and the barrier metal layer 330, respectively. In this example, titanium disilicide ($TiSi_2$) may be formed during the anneal step mentioned above. The thermal cycle of the anneal can be adjusted such that the silicide-forming reaction completely converts the Ti layer 300 in contact with the source/drain region 80 to $TiSi_2$ to form silicide regions 400. Since $TiSi_2$ is a good conductor of electricity and the interface between $TiSi_2$ and heavily-doped Si is an ohmic contact with a low specific contact resistance, forming such a silicide region 400 may help increase the current drive of the FinFET 100.

FIG. 14 illustrates a contact 150 making electrical contact to conductive gate layer 98, which is a gate electrode of FinFET 100 formed over respective STI region 62. A contact opening over a gate structure 97 may be formed by removing second ILD 200 to expose the gate structure 97. In some embodiments, the process step to etch contact openings (as well as all other processing steps) to form contacts over source/drain regions 80 and over gate structures 97 may be performed simultaneously. In other embodiments, first a mask may be patterned to expose second ILD 200 in all contact regions, and the exposed second ILD 200 is completely removed, but a portion of the first ILD 90 remains over the contact regions of source/drain regions 80. Thus, at the end of this etch step the contact openings over gate regions are fully formed to expose a top surface of gate structure 97. However, contact openings over source/drain regions are partially formed. A second patterned etch using a second patterned mask that protects the area over the gate structures 97 but exposes the partially formed contact openings over source/drain regions, may be used to remove the remaining first ILD 90 to expose a top surface of source/drain regions 80. In yet other embodiments, contact openings over the two types of contact regions may be formed individually. For example, contact openings over source/drain regions 80 may be formed using a first patterned mask that protects the area over the gate structures 97. Then a second etching step may be performed to form contact openings over gate structures 97 using a second patterned mask that protects the area over the source/drain regions 80.

In some embodiments, a conductive fill layer 140 may be deposited over the conductive liner layer 120 to fill the contact openings, using any acceptable deposition technique (e.g., CVD, PECVD, PVD, ECP, electroless plating, or the like, or any combination thereof). The conductive material of fill layer 140 may comprise tungsten, although other conductive materials such as, Al, Cu, Ru, Ni, Co, alloys of these, combinations thereof, and the like, may alternatively be utilized. Next a planarization process (e.g., CMP) may be used to remove excess portions of all the conductive materials from over the surface of ILD 200 outside of the contact openings to form conductive plugs that extend into the second ILD 200 and first ILD 90. Referring to FIGS. 13 and 14, contact plugs 150 over source/drain regions 80 and gate regions 97 make contact with the respective electrodes of FinFET 100. FIG. 13 illustrates the electrical connections formed by contacts 150 to the source/drain regions 80, whereas; FIG. 14 illustrates the electrical connections formed by contacts 150 to the gate 97.

This disclosure describes embodiments of methods for depositing a semiconductor layer over a surface having an uneven topography, such as depositing a-Si over a surface topography of closely spaced semiconductor fins protruding above STI regions from a semiconductor substrate. The deposition methods described provide advantages associated with reducing or preventing formation of void and seam defects as a-Si is deposited in the trenches between adjacent fins during formation of an a-Si layer, which in some embodiments may be used a dummy gate structure for fabricating FinFETs. For example, this disclosure describes a deposition step being implemented in some embodiments as multiple cycles of alternating deposition and anneal. The anneal steps inserted between successive depositions of relatively thin a-Si films allows hydrogen to periodically desorb from a-Si, thereby preventing a relatively large exodus of hydrogen during a high-temperature, low-pressure exhaust step done at the end of the deposition step. This technique of embedding a deposition-anneal loop in the process flow substantially reduces or removes buildup of mechanical stresses exerted by a volume shrink of the a-Si film adhering to the sidewalls of fins caused by desorption of hydrogen. Some of the fins may otherwise bend towards each other and constrict the opening near the top of the fins. Further constricting the opening of a narrow trench in this manner may cause incomplete fill resulting in undesirable voids and seams in the a-Si layer formed between fins. Hence, by reducing/eliminating fin bending, the defect density of the deposition process is greatly improved. This may enable the a-Si deposition to completely fill trenches with a higher aspect ratio, thereby allowing the minimum space between fins to be reduced to achieve a higher packing density of electronic components in semiconductor integrated circuits.

A further advantage of using the embodiments described herein is that, in addition to reducing void and seam defects at the a-Si deposition step, suppression of fin bending reduces the defect density at processing steps downstream in the fabrication flow which may be caused by fin bending. For example, occurrences of a-Si residues at dummy gate etch may be reduced as occurrences of re-entrant fin sidewalls of bent fins are eliminated or reduced. Furthermore, exposed voids/seams in dummy gate structures may interfere with spacer formation and result in crystal defects formed in source/drain regions during epitaxial growth. Occurrences of these types of defects would also be reduced as voids/seam defects occurrences of get eliminated. Thus, by reducing defect density, the embodiments described in this disclosure may be able to increase production yields of integrated circuits.

In an embodiment, a method of forming a semiconductor device includes forming a first fin and a second fin protruding from a substrate; depositing a first layer of amorphous silicon between the first fin and the second fin, the first layer of amorphous silicon extending along sidewalls of the first fin and the second fin; annealing the first layer of amorphous silicon; after annealing, depositing a second layer of amorphous silicon over the first layer of amorphous silicon; annealing the second layer of amorphous silicon; and after annealing the second layer of amorphous silicon, depositing a third layer of amorphous silicon, the third layer of amorphous silicon extending over an upper surface of the first fin and the second fin. In an embodiment, depositing the first layer of amorphous silicon, annealing the first layer of amorphous silicon, depositing the second layer of amorphous silicon, and annealing the second layer of amorphous silicon are performed at a same temperature. In an embodiment, a gap between the first fin and the second fin is completely filled with amorphous silicon after depositing the third layer of amorphous silicon, wherein remaining portions of the first layer of amorphous silicon, the second layer of amorphous silicon, and the third layer of amorphous silicon form an amorphous silicon layer. In an embodiment, the method further includes, after depositing the third layer of amorphous silicon, planarizing the amorphous silicon layer, the amorphous silicon layer extending over an upper surface of the first fin and the second fin after the planarizing. In an embodiment, the method further includes patterning the amorphous silicon layer to form a dummy gate structure; forming a dielectric layer along opposing sides of the dummy gate structure; removing the dummy gate structure, thereby forming a recess in the dielectric layer; and forming a gate electrode in the recess. In an embodiment, the method further includes, prior to depositing a second layer of amorphous silicon, etching at least a portion of the first layer of amorphous silicon from an upper portion of sidewalls of the first fin and the second fin, thereby widening an opening between an upper portion of the first layer of amorphous silicon on the first fin and an upper portion of the first layer of amorphous silicon on the second fin.

In an embodiment, a method of forming a semiconductor device includes forming a first fin and a second fin protruding from a substrate; performing one or more deposition/etch cycles, each deposition/etch cycle including performing a plurality of deposition cycles, each deposition cycle including depositing a material layer; and annealing the material layer; and etching at least a portion of the material layer from sidewalls of the first fin and the second fin; and after performing the one or more deposition/etch cycles, depositing an upper material layer. In an embodiment, the depositing the material layer is performed at a temperature of about 400° C. to about 600° C. In an embodiment, the annealing the material layer is performed at a temperature of about 400° C. to about 600° C. In an embodiment, a temperature during the depositing is a same temperature during the annealing. In an embodiment, the material layer comprises amorphous silicon. In an embodiment, the annealing comprises desorbing hydrogen from the amorphous silicon. In an embodiment, performing the one or more deposition cycles deposits a thickness between about 0.5 nm and about 5 nm of material prior to the etching. In an embodiment, the annealing is performed in an ambient of $N_2$ or $H_2$.

In an embodiment, a method of forming a semiconductor device includes forming a first fin and a second fin protruding from a substrate; depositing and annealing a plurality of sacrificial layers, wherein the annealing is performed on each of the plurality of sacrificial layers prior to depositing a next sacrificial layer of the plurality of sacrificial layers, wherein after depositing and annealing the plurality of sacrificial layers a lowermost portion of an upper surface of an uppermost sacrificial layer of the plurality of sacrificial layers is lower than an uppermost surface of the first fin and the second fin; and depositing an additional sacrificial layer over the plurality of sacrificial layers, an upper surface of the additional sacrificial layer being completely above the uppermost surface of the first fin and the second fin. In an embodiment, the annealing is performed in a same chamber as the depositing. In an embodiment, each of the plurality of sacrificial layers has a thickness between about 0.5 nm and about 5 nm. In an embodiment, the method further includes, prior to depositing the additional sacrificial layer, etching the plurality of sacrificial layers. In an embodiment, the annealing desorbs hydrogen from the sacrificial layers. In an embodiment, the annealing reduces a volume of at least one of the sacrificial layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a first fin and a second fin protruding from a substrate;
   depositing a first layer of amorphous silicon between the first fin and the second fin, the first layer of amorphous silicon extending along sidewalls of the first fin and the second fin;
   performing a first anneal after depositing the first layer of amorphous silicon;
   after the first anneal, depositing a second layer of amorphous silicon over the first layer of amorphous silicon;
   performing a second anneal after depositing the second layer of amorphous silicon; and
   after the second anneal, depositing a third layer of amorphous silicon, the third layer of amorphous silicon extending over an upper surface of the first fin and the second fin.

2. The method of claim 1, wherein a gap between the first fin and the second fin is completely filled with amorphous silicon after depositing the third layer of amorphous silicon, wherein remaining portions of the first layer of amorphous silicon, the second layer of amorphous silicon, and the third layer of amorphous silicon form an amorphous silicon layer.

3. The method of claim 2, further comprising:
   after depositing the third layer of amorphous silicon, planarizing the amorphous silicon layer without exposing the first fin or the second fin.

4. The method of claim 2, further comprising:
   patterning the amorphous silicon layer to form a dummy gate structure;
   forming a dielectric layer along opposing sides of the dummy gate structure;
   removing the dummy gate structure, thereby forming a recess in the dielectric layer; and
   forming a gate electrode in the recess.

5. The method of claim 1, wherein depositing the first layer of amorphous silicon is performed at a different temperature than performing the first anneal.

6. The method of claim 1, further comprising:
prior to depositing a-second layer of amorphous silicon, etching at least a portion of the first layer of amorphous silicon from an upper portion of sidewalls of the first fin and the second fin, thereby widening an opening between an upper portion of the first layer of amorphous silicon on the first fin and an upper portion of the first layer of amorphous silicon on the second fin.

7. A method of forming a semiconductor device, the method comprising:
forming a first fin and a second fin protruding from a substrate;
performing one or more deposition/etch cycles, each deposition/etch cycle comprising:
performing a plurality of deposition cycles, each deposition cycle comprising:
depositing a silicon layer; and
annealing; and
etching at least a portion of the silicon layer from sidewalls of the first fin and the second fin; and
after performing the one or more deposition/etch cycles, depositing an upper silicon layer.

8. The method of claim 7, wherein the depositing the silicon layer is performed at a temperature of about 400° C. to about 600° C.

9. The method of claim 8, wherein the annealing the silicon layer is performed at a temperature of about 400° C. to about 600° C.

10. The method of claim 7, wherein the silicon layer comprises amorphous silicon.

11. The method of claim 10, wherein the annealing comprises desorbing hydrogen from the amorphous silicon.

12. The method of claim 7, wherein a temperature during the depositing is lower than a temperature during the annealing.

13. The method of claim 7, wherein performing the plurality of deposition cycles deposits a thickness between about 0.5 nm and about 5 nm of material prior to the etching.

14. The method of claim 7, wherein the annealing is performed in an ambient of $N_2$ or $H_2$.

15. A method of forming a semiconductor device, the method comprising:
forming a first fin and a second fin protruding from a substrate;
depositing and annealing a plurality of sacrificial layers, wherein the annealing is performed on each of the plurality of sacrificial layers prior to depositing a next sacrificial layer of the plurality of sacrificial layers, wherein after depositing and annealing the plurality of sacrificial layers a lowermost portion of an upper surface of an uppermost sacrificial layer of the plurality of sacrificial layers is lower than an uppermost surface of the first fin and the second fin; and
depositing an additional sacrificial layer over the plurality of sacrificial layers, an upper surface of the additional sacrificial layer being completely above the uppermost surface of the first fin and the second fin.

16. The method of claim 15, wherein the annealing is performed in a same chamber as the depositing.

17. The method of claim 15, wherein each of the plurality of sacrificial layers has a thickness between about 0.5 nm and about 5 nm.

18. The method of claim 15, further comprising, prior to depositing the additional sacrificial layer, etching the plurality of sacrificial layers.

19. The method of claim 15, wherein the annealing desorbs hydrogen from the sacrificial layers.

20. The method of claim 15, wherein the annealing reduces a volume of at least one of the sacrificial layers.

* * * * *